(12) United States Patent
Miyakoshi

(10) Patent No.: US 11,929,312 B2
(45) Date of Patent: Mar. 12, 2024

(54) SEMICONDUCTOR DEVICE

(71) Applicant: FUJI ELECTRIC CO., LTD., Kawasaki (JP)

(72) Inventor: Masaoki Miyakoshi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 71 days.

(21) Appl. No.: 17/589,510

(22) Filed: Jan. 31, 2022

(65) Prior Publication Data
US 2022/0301997 A1 Sep. 22, 2022

(30) Foreign Application Priority Data

Mar. 19, 2021 (JP) ................................. 2021-046046

(51) Int. Cl.
*H01L 23/498* (2006.01)
*H01L 23/538* (2006.01)

(52) U.S. Cl.
CPC .............................. *H01L 23/49811* (2013.01)

(58) Field of Classification Search
CPC ...................... H01L 23/49811; H01L 23/5386
See application file for complete search history.

(56) References Cited

U.S. PATENT DOCUMENTS

| | | | | |
|---|---|---|---|---|
| 6,190,181 B1* | 2/2001 | Affolter | ............. | H01R 13/2421 |
| | | | | 439/70 |
| 2008/0176454 A1* | 7/2008 | Imai | ....................... | H01R 13/41 |
| | | | | 439/682 |
| 2009/0194884 A1 | 8/2009 | Stolze | | |
| 2014/0317896 A1 | 10/2014 | Maruyama et al. | | |
| 2016/0343647 A1 | 11/2016 | Kai et al. | | |
| 2020/0286800 A1 | 9/2020 | Maruyama et al. | | |
| 2021/0053106 A1* | 2/2021 | Miao | ....................... | B21J 13/025 |
| 2021/0375734 A1 | 12/2021 | Maruyama et al. | | |
| 2023/0039374 A1* | 2/2023 | Abe | ....................... | F16G 13/06 |

FOREIGN PATENT DOCUMENTS

| | | |
|---|---|---|
| EP | 2782431 A2 | 9/2014 |
| EP | 3703122 A1 | 9/2020 |
| JP | 2014-123618 A | 7/2014 |
| JP | 2014-187179 A | 10/2014 |
| JP | 2016-219554 A | 12/2016 |
| JP | 2019/244482 A1 | 12/2019 |
| JP | 2021-190221 A | 12/2021 |

* cited by examiner

*Primary Examiner* — Michele Fan
(74) *Attorney, Agent, or Firm* — Rabin & Berdo, P.C.

(57) ABSTRACT

A semiconductor device includes a conductive board, a contact component having a cylindrical through hole and including a main body portion with first and second open ends, and an external connection terminal inserted in the through hole of the contact component, having four outer surfaces extending in an insertion direction to form a quadrangular prism shape, and having four corner portions along an insertion direction pressed by an inner circumferential surface of the through hole of the contact component. The external connection terminal has protrusions, each of which is disposed on a respective one of at least one pair of opposite outer surfaces among the four outer surfaces, and being pressed by the inner circumferential surface of the through hole.

15 Claims, 17 Drawing Sheets

SEMICONDUCTOR DEVICE

CROSS-REFERENCE TO RELATED APPLICATION

This application is based upon and claims the benefit of priority of the prior Japanese Patent Application No. 2021-046046, filed on Mar. 19, 2021, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices and are used as power converter devices. The power devices referred to here include insulated gate bipolar transistors (IGBTs) and power metal oxide semiconductor field effect transistors (MOSFETs). In a semiconductor device, a semiconductor chip including a power device, and an insulated circuit board are sealed using a sealing member. The insulated circuit board has an insulated board and a circuit pattern formed on the front surface of the insulated board. The semiconductor chip is disposed on the circuit pattern, and external connection terminals are provided via contact components or "contact elements" (see, for example, U.S. Patent Application Publication No. 2009/0194884). When a signal is applied to an external connection terminal, the signal is inputted into the semiconductor chip via the contact component and the circuit pattern.

A printed circuit board is further attached to the external connection terminals. During attachment, vias in the printed circuit board are pressed onto the external connection terminals that extend upward from the semiconductor device, which attaches the external connection terminals to the vias.

To handle large currents, the printed circuit board described above may be formed of a multilayer board, for example, and the thickness of a copper plate included in the multilayer board may be increased. This also results in increased rigidity for the printed circuit board. During attachment of the printed circuit board to the external connection terminals, the insertion force for pressing the printed circuit board onto the external connection terminals may exceed the insertion force used to press the external connection terminals onto the contact components, which may result in the external connection terminals being passing through (that is, coming off) the contact components. An external connection terminal that comes off on the inside of a contact component may apply force directly to the front surface of the insulated circuit board to which the contact component is attached, which may damage the insulated board and deteriorate electrical insulation.

SUMMARY OF THE INVENTION

According to one aspect, there is provided a semiconductor device, including: a conductive board; a contact component having a cylindrical through hole therein, and including a main body portion with a first open end and a second open end opposite to each other in an insertion direction orthogonal to a surface of the conductive board, the contact component at the first open end being joined to the conductive board; and an external connection terminal having four outer surfaces extending in the insertion direction to form a quadrangular prism shape, and being inserted into the through hole of the contact component in the insertion direction, the external connection terminal having four corner portions along the insertion direction pressed by an inner circumferential surface of the through hole of the contact component, wherein the external connection terminal has protrusions, each of which is disposed on a respective one of at least one pair of opposite outer surfaces among the four outer surfaces, and being pressed by the inner circumferential surface of the through hole.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings. Note that in the following description, the expressions "front surface" and "upper surface" refer to the surface of a semiconductor device 1 that faces upward (the "+Z direction") in FIG. 1. In the same way, the expression "up" refers to the upward direction (the "+Z direction") for the semiconductor device 1 in FIG. 1. The expressions "rear surface" and "lower surface" refer to the surface of the semiconductor device 1 that faces downward (the "−Z direction") in FIG. 1. In the same way, the expression "down" refers to the downward direction (the "−Z direction") for the semiconductor device 1 in FIG. 1. These expressions are used as needed to indicate the same directions in the other drawings. The expressions "front surface", "upper surface", "up", "rear surface", "lower surface", "down", and "side surface" are merely convenient expressions used to specify relative positional relationships, and are not intended to limit the technical scope of the present embodiments. As one example, "up" and "down" do not necessarily mean directions that are perpendicular to the ground. That is, the "up" and "down" directions are not limited to the direction of gravity. Additionally, in the following description, the expression "main component" refers to a component that composes 80% or higher by volume out of all the components.

First Embodiment

Figure 1:
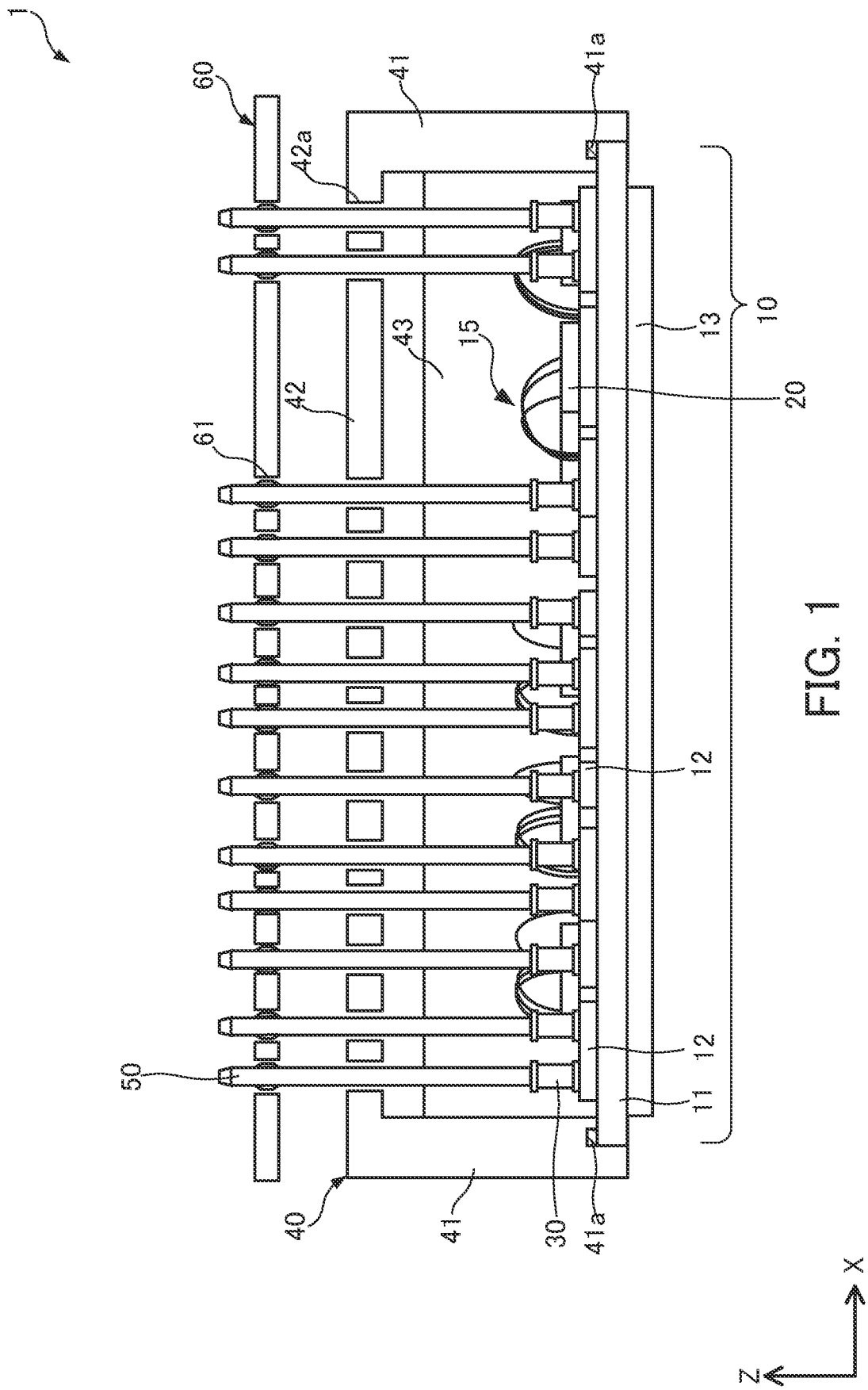
FIG. 1 is a cross-sectional view of a semiconductor device according to a first embodiment.
Figure 2:
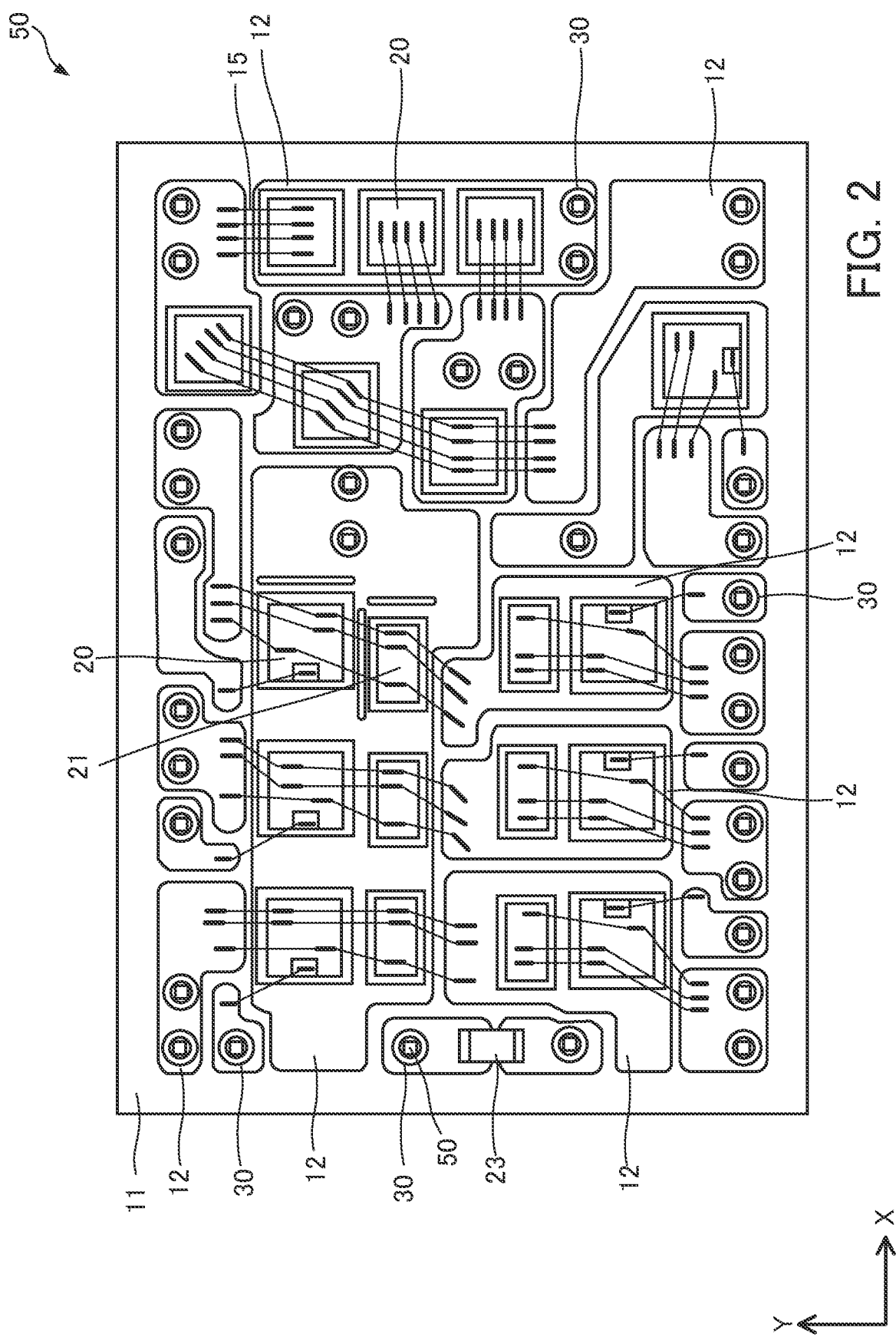
FIG. 2 is a plan view of an insulated circuit board included in the semiconductor device according to the first embodiment.

The semiconductor device 1 according to the first embodiment will now be described with reference to FIGS. 1 and 2. FIG. 1 is a cross-sectional view of the semiconductor device according to the first embodiment and FIG. 2 is a plan view of an insulated circuit board included in the semiconductor device according to the first embodiment. Note that FIG. 2 is a plan view in which a sealing member 43, a case 40, and a printed circuit board 60 have been removed from the semiconductor device 1 in FIG. 1. Also note that in the present embodiment, a plurality of circuit patterns 12, first and second semiconductor chips 20 and 21, a plurality of contact components 30, a plurality of bonding wires 15, and a plurality of external connection terminals 50 are described using the same reference numerals without distinguishing between elements of the same type. Other component elements provided in plural are also described using the same reference numerals without distinguishing between the individual elements.

As depicted in FIGS. 1 and 2, the semiconductor device 1 includes an insulated circuit board 10 and the first and second semiconductor chips 20 and 21 and an electronic component 23 that are joined to a front surface of the insulated circuit board 10. The semiconductor device 1 also includes the contact components 30 which are joined to the front surface of the insulated circuit board 10. The first and second semiconductor chips 20 and 21, the electronic component 23, and the contact components 30 are joined to the front surface of the insulated circuit board 10 via joining members (not illustrated). The semiconductor device 1 also has bonding wires 15 that electrically connect the front surface of the insulated circuit board 10 and main electrodes of the first and second semiconductor chips 20 and 21. External connection terminals 50 are press-fitted into the contact components 30. In the semiconductor device 1, these components are covered with the case 40. The case 40 is joined to an outer circumferential portion of an insulated board 11 of the insulated circuit board via adhesive 41a. Note that tip portions of the external connection terminals 50 extend upward (that is, in the +Z direction) from the case 40. In the semiconductor device 1, the inside of the case 40 is sealed with a sealing member 43. The semiconductor device 1 is also equipped with the printed circuit board 60. The printed circuit board 60 is attached to the external connection terminals 50 that extend upward from the case 40.

The insulated circuit board 10 includes the insulated board 11, the plurality of circuit patterns 12 provided on the front surface of the insulated board 11, and a metal plate 13 provided on a rear surface of the insulated board 11. The insulated board 11 and the metal plate 13 are rectangular in shape in a plan view. Corner portions of the insulated board 11 and the metal plate 13 may be R-chamfered or C-chamfered. In a plan view, the metal plate 13 is smaller in size than the insulated board 11, and is formed on the inside of the insulated board 11. The insulated board 11 is made of an electrically insulating material that has superior thermal conductivity. The insulated board 11 is made of a ceramic or an insulating resin. Examples of ceramics include aluminum oxide, aluminum nitride, and silicon nitride. Examples of insulating resin include a phenolic paper substrate, a paper epoxy substrate, a glass composite substrate, and a glass epoxy substrate. The thickness of the insulated board 11 is at least 0.2 mm but not greater than 2.5 mm.

The plurality of circuit patterns 12 are made of a metal with superior conductivity. Examples of suitable metals include copper, aluminum, or an alloy containing at least one of these metals as a main component. The thickness of the plurality of circuit patterns 12 is at least 0.1 mm and not greater than 2.0 mm. The surfaces of the plurality of circuit patterns 12 may be plated to improve corrosion resistance. When doing so, a plating material such as nickel, nickel-phosphorus alloy, and nickel-boron alloy may be used. The plurality of circuit patterns 12 are produced on the insulated board 11 by forming a metal layer on the front surface of the insulated board 11 and performing a treatment on the metal layer, such as etching. Alternatively, a plurality of circuit patterns 12 that have been cut out from a metal layer in advance may be pressure-bonded to the front surface of the insulated board 11. Note that the plurality of circuit patterns 12 depicted in FIG. 2 are mere examples. The number, shapes, sizes, and the like of the circuit patterns 12 may be selected as appropriate.

The metal plate 13 has a smaller area than the insulated board 11, is wider than the area of the region where the circuit patterns 12 are formed, and is formed with a rectangular shape in the same way as the insulated board 11. Corner portions of the metal plate 13 may be R-chamfered or C-chamfered. The metal plate 13 is smaller in size than the insulated board 11 and is formed on the entire surface of the insulated board 11 aside from edge portions. The metal plate 13 has a metal with superior thermal conductivity as a main component. Examples of suitable metals include copper, aluminum, or an alloy containing at least one of these metals. The thickness of the metal plate 13 is at least 0.1 mm and not greater than 2.5 mm. A plating treatment may be performed to improve the corrosion resistance of the metal plate 13. When doing so, a plating material such as nickel, nickel-phosphorus alloy, and nickel-boron alloy may be used.

Examples of an insulated circuit board 10 with this configuration include a direct copper bonding (DCB) substrate, an active metal brazed (AMB) substrate, and an insulated resin board. A cooling unit (not illustrated) may be attached via a thermal interface material to the metal plate 13 of the insulated circuit board 10. By doing so, heat dissipation by the semiconductor device 1 may be improved. Note that "thermal interface material" is a general term for a variety of materials, including thermally conductive grease, an elastomer sheet, room temperature vulcanization (RTV) rubber, gel, and a phase change material. An example of the grease is silicone mixed with a metal oxide filler. As examples, the cooling unit used in this case is made of aluminum, iron, silver, or copper that have superior thermal conductivity, or an alloy containing at least one of these metals. As the cooling unit, it is also possible to use a heat sink formed of one or a plurality of fins and a cooling device that performs water cooling or the like.

The bonding wires 15 provide appropriate electrical connections between the first and second semiconductor chips 20 and 21 and the circuit patterns 12, or between the plurality of first and second semiconductor chips 20 and 21 themselves. The bonding wires 15 are made of a material with superior conductivity. As example materials, the bonding wires 15 are made of gold, silver, copper, aluminum, or an alloy containing at least one of these metals. As one example, the diameter of the bonding wires 15 for control purposes is at least 110 μm and not greater than 400 μm. As another example, the diameter of the bonding wires 15 for the main current may be at least 300 μm and not greater than 500 μm.

The first semiconductor chips 20 include a power device element made of silicon or silicon carbide. The power device element is a switching element. As examples, the switching element is an IGBT or a power MOSFET. As one example, the first semiconductor chip 20 has a drain electrode (or collector electrode) as a main electrode on the rear surface, and a gate electrode and a source electrode (or an emitter electrode) as a control electrode and a main electrode on the front surface.

The second semiconductor chips 21 are diode elements made of silicon or silicon carbide. As examples, the diode elements are free wheeling diodes (FWDs), such as Schottky barrier diodes (SBDs) or P-intrinsic-N (PiN) diodes. Each second semiconductor chip 21 is provided with a cathode electrode as a main electrode on the rear surface and an anode electrode as a main electrode on the front surface. As one example, the thickness of the first and second semiconductor chips 20 and 21 is at least 50 μm and not greater than 220 μm.

In place of the first and second semiconductor chips 20 and 21, reverse-conducting (RC)-IGBT that combine the functions of an IGBT and an FWD may be used. Also as needed, in place of any of the first and second semiconductor chips 20 and 21, it is also possible to dispose a lead frame, external connection terminals (pin terminals, contact components, and the like), and an electronic component (such as a thermistor or a current sensor).

Examples of the electronic component 23 include a capacitor, a resistor, a thermistor, a current sensor, and a control integrated circuit (IC). One or more electronic components 23 may be mounted on the circuit patterns 12 to obtain desired functions in the semiconductor device 1. Electronic components 23 may also be used in combination as appropriate to realize the desired functions.

Rear surfaces of the first and second semiconductor chips 20 and 21 are mechanically and electrically joined to predetermined circuit patterns 12 via joining members (not illustrated). Note that the joining members may be solder or sintered metal. Lead-free solder may be used as the solder. As one example, lead-free solder has an alloy containing at least two of tin, silver, copper, zinc, antimony, indium, and bismuth as a main component. The solder may additionally contain additives. Examples of additives include nickel, germanium, cobalt, and silicon. Solder that contains additives has improved wettability, gloss, and bonding strength, which may improve reliability. Silver is an example of a metal used as sintered metal.

Out of the plurality of circuit patterns 12, the contact components 30 are often provided via solder on the circuit patterns 12 on the outer edges of the insulated board 11. On the other hand, the first and second semiconductor chips 20 and 21 are often disposed via solder on circuit patterns 12 inside the circuit patterns 12 at the outer edges. The contact components 30 each include a main body portion, in which a cylindrical through hole is internally formed, and flanges provided at open end portions of the main body portion. The contact components 30 are made of a metal with superior conductivity. Examples of suitable metals include silver, copper, nickel, or an alloy containing at least one of these metals. To improve corrosion resistance, a plating film may be formed by plating on the surface of each contact component 30. Example materials used for the plating film include nickel, nickel-phosphorus alloy, and nickel-boron alloy. The contact components 30 will be described in detail later in this specification.

Each contact component 30 is mechanically and electrically joined at one open end portion to a predetermined circuit pattern 12 via a joining member (not illustrated). Each contact component 30 is also disposed so that the through hole is perpendicular to the front surface of the circuit pattern 12. The joining member may be solder or sintered metal. Lead-free solder may be used as the solder. As one example, lead-free solder has an alloy containing at least two of tin, silver, copper, zinc, antimony, indium, and bismuth as a main component. The solder may additionally contain additives. Examples of additives include nickel, germanium, cobalt, and silicon. Solder that contains additives has improved wettability, gloss, and bonding strength, which may improve reliability. Silver and silver alloy are examples of metals used as sintered metal.

Each external connection terminal 50 has a trunk portion in the form of a prism and tip portions in the form of truncated cones provided at both ends of the trunk portion. The external connection terminal 50 is press-fitted into a through hole from the open end portion-side of a contact component 30 at the opposite end to the side of the contact component 30 joined to a circuit pattern 12. Each external connection terminal 50 is disposed in parallel to the through hole in a contact component 30. This means that the external connection terminals 50 are disposed so as to be perpendicular to the front surface of the circuit pattern 12. The external connection terminals 50 are made of a metal with superior conductivity. Examples of suitable metals include silver, copper, nickel, or an alloy containing at least one of these metals. To improve corrosion resistance, a plating film may be formed by plating on the surface of each external connection terminal 50. Example materials used for the plating film include nickel, nickel-phosphorus alloy, and nickel-boron alloy. Note that the external connection terminals 50 will be described in detail later in this specification.

The case 40 has an outer circumferential portion 41 and an upper lid portion 42. The outer circumferential portion 41 surrounds the periphery of the insulated circuit board 10 described above. The outer circumferential portion 41 is a box shape that is substantially rectangular in a plan view. Fixing holes (not illustrated) are formed at each of the four corners of the outer circumferential portion 41 in a plan view. The fixing holes are holes that pass through the outer circumferential portion 41 from the front surface to the rear surface. The upper lid portion 42 covers the upper part of an opening in the outer circumferential portion and is integrally attached to the outer circumferential portion 41. Insertion holes 42a are formed in the upper lid portion 42 corresponding to the external connection terminals 50. The case 40 is made of thermoplastic resin, that is, a resin that has a thermoplastic resin as a main component. Examples of thermoplastic resin include polyphenylene sulfide resin, polybutylene terephthalate resin, polybutylene succinate resin, polyamide resin, and acrylonitrile butadiene styrene resin.

The sealing member 43 seals the inside of the case 40 at least to a height that is sufficient to seal the first and second semiconductor chips 20 and 21, the contact components 30, and the bonding wires 15. As one example, the sealing member 43 may be silicone gel. The sealing member 43 includes a thermosetting resin and a filler which is contained in thermosetting resin. As examples, the thermosetting resin is epoxy resin, phenol resin, or maleimide resin. As examples, the filler is silicon oxide, aluminum oxide, boron nitride or aluminum nitride. One example of the sealing member 43 includes an epoxy resin and a filler. As examples, the filler is silicon dioxide, aluminum oxide, boron nitride, or aluminum nitride.

The printed circuit board 60 is equipped with an insulated board and a plurality of circuit patterns formed on at least one of the front surface and the rear surface of the insulated board. A plurality of vias 61, which are through holes that pass through from the front surface to the rear surface, are formed in the printed circuit board 60 at positions corresponding to the external connection terminals 50 of the semiconductor device 1. The insulated board is in the form of a flat plate and is made of an insulating material. As the insulating material, a material produced by soaking a substrate in resin is used. As examples, paper, glass cloth, or glass non-woven fabric is used as the substrate. Phenol resin, epoxy resin, or polyimide resin is used as the resin. Specific examples of the insulated board include a phenolic paper substrate, a paper epoxy substrate, a glass epoxy substrate, a glass polyimide substrate, and a glass composite substrate. The insulated board is rectangular in a plan view. The corners of the insulated board may be R-chamfered or C-chamfered. The circuit patterns are provided in a plurality of pattern shapes to form predetermined circuits. The circuit patterns are made of a material with superior conductivity. Example materials include silver, copper, nickel, or an alloy containing at least one of these metals. To improve corrosion resistance, the surfaces of upper circuit patterns and lower circuit patterns may be plated. Example materials used in the plating process include nickel, nickel-phosphorus alloy, and nickel-boron alloy. The vias 61 are each electrically connected as appropriate to at least one of an upper circuit pattern and a lower circuit pattern. In the semiconductor device 1, the external connection terminals 50 are press-fitted into the vias 61 of the printed circuit board 60. By doing so, the printed circuit board 60 and the semiconductor device 1 are electrically connected.

Figure 3A:
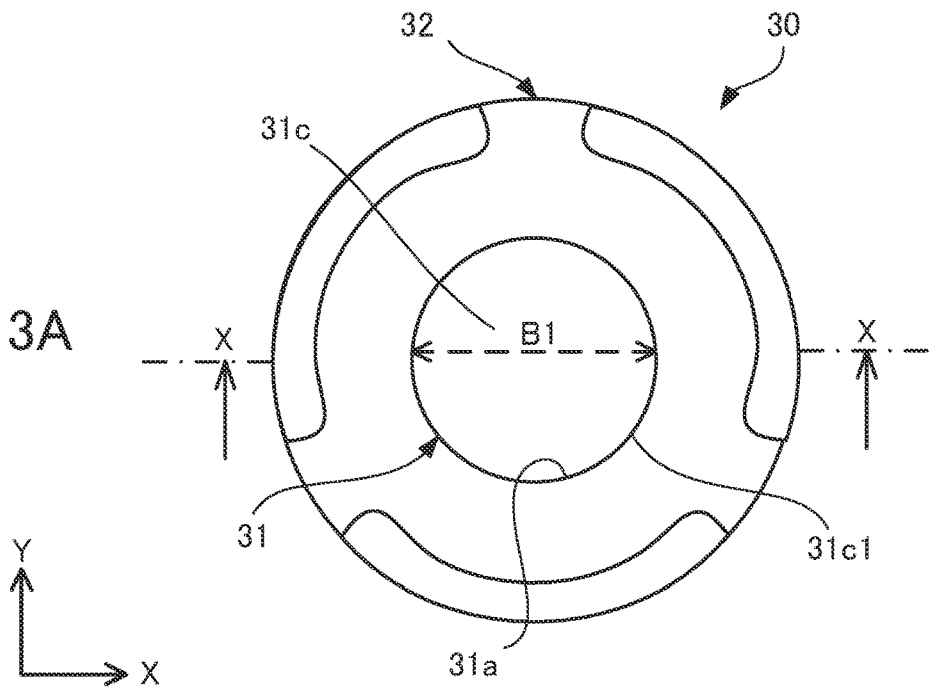
FIGS. 3A and 3B depict a contact component included in the semiconductor device according to the first embodiment.
Figure 3B:
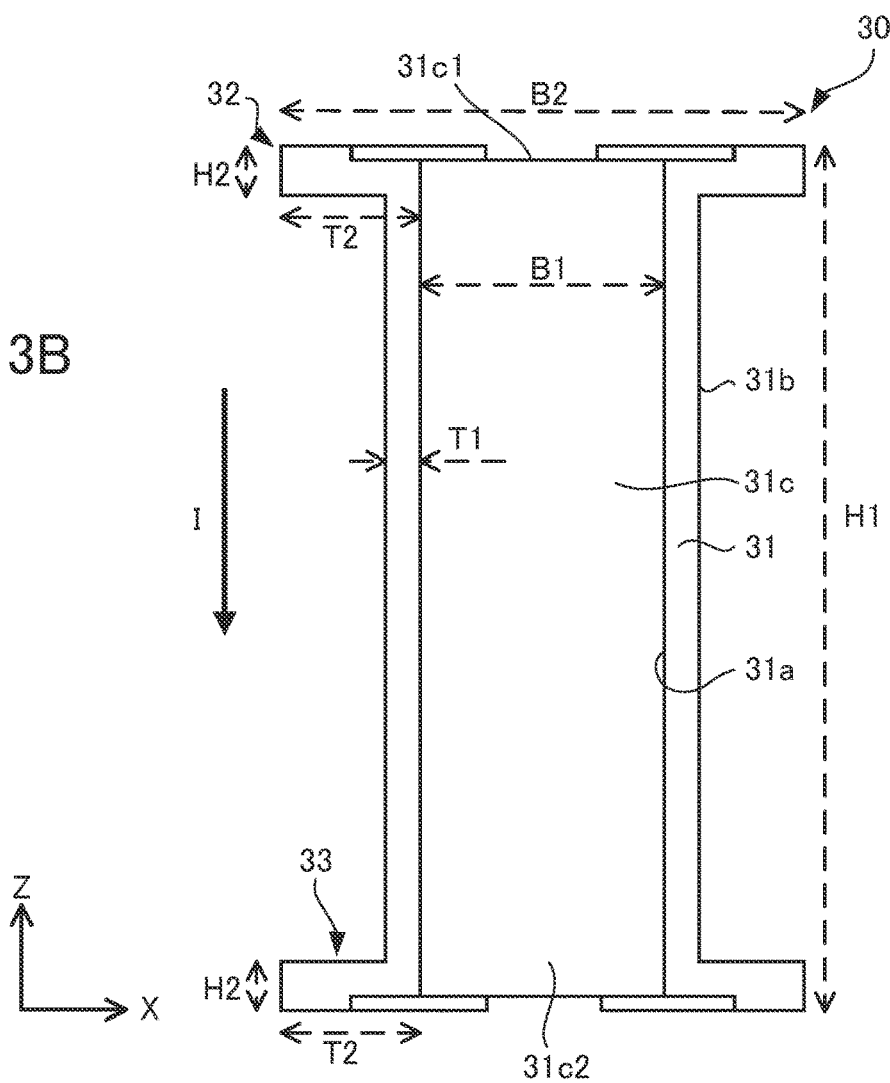

Next, the contact components 30 included in the semiconductor device 1 will be described with reference to FIGS. 3A and 3B. FIGS. 3A and 3B depict a contact component included in the semiconductor device according to the first embodiment. Note that FIG. 3A is a plan view of an open end portion 31c1-side of FIG. 3B and that FIG. 3B is a cross-sectional view taken along a dot-dash line X-X in FIG. 3A.

Each contact component 30 includes the main body portion 31 and the flanges 32 and 33 that are provided at open end portions 31c1 and 31c2 of the main body portion 31. The main body portion 31 is formed with the cylindrical through hole 31c, and has an inner circumferential surface 31a and an outer circumferential surface 31b. As one example, an inner diameter B1 of the through hole 31c is at least 0.2 mm and not greater than 2.0 mm. Also as one example, a thickness T1 of the main body portion 31 is at least 50 μm and not greater than 0.5 mm. The flanges 32 and 33 are formed at the open end portions 31c1 and 31c2 respectively of the through hole 31c in the main body portion 31. An outer diameter B2 of the flanges 32 and 33 is larger than the inner diameter B1, and as one example is at least 1.0 mm but not greater than 4.0 mm. A width T2 from the through hole 31c of the main body portion 31 of the flanges 32 and 33 is the difference between the outer diameter B2 and the inner diameter B1 of the flanges 32 and 33, and as one example is at least 0.8 mm but not greater than 2.0 mm. A thickness H2 of the flanges 32 and 33 may be the same as the thickness T1 of the main body portion 31, and as one example may be at least 50 μm and not greater than 0.5 mm. The height H1 of each contact component 30 is a height that accommodates a predetermined insertion range of the external connection terminal 50, and as one example, is at least 2.0 mm but not greater than 20 mm.

One open end portion (hereinafter, the "first open end portion") 31c2 of each contact component 30 is joined to a circuit pattern 12 and the external connection terminal 50 is inserted from the other open end portion (hereinafter, the "second open end portion") 31c1 at the opposite end of the contact component 30 to the first open end portion 31c2. Accordingly, the external connection terminal 50 is inserted into the contact component 30 from the second open end portion 31c1 along an insertion direction I toward the first open end portion 31c2.

Figure 4:
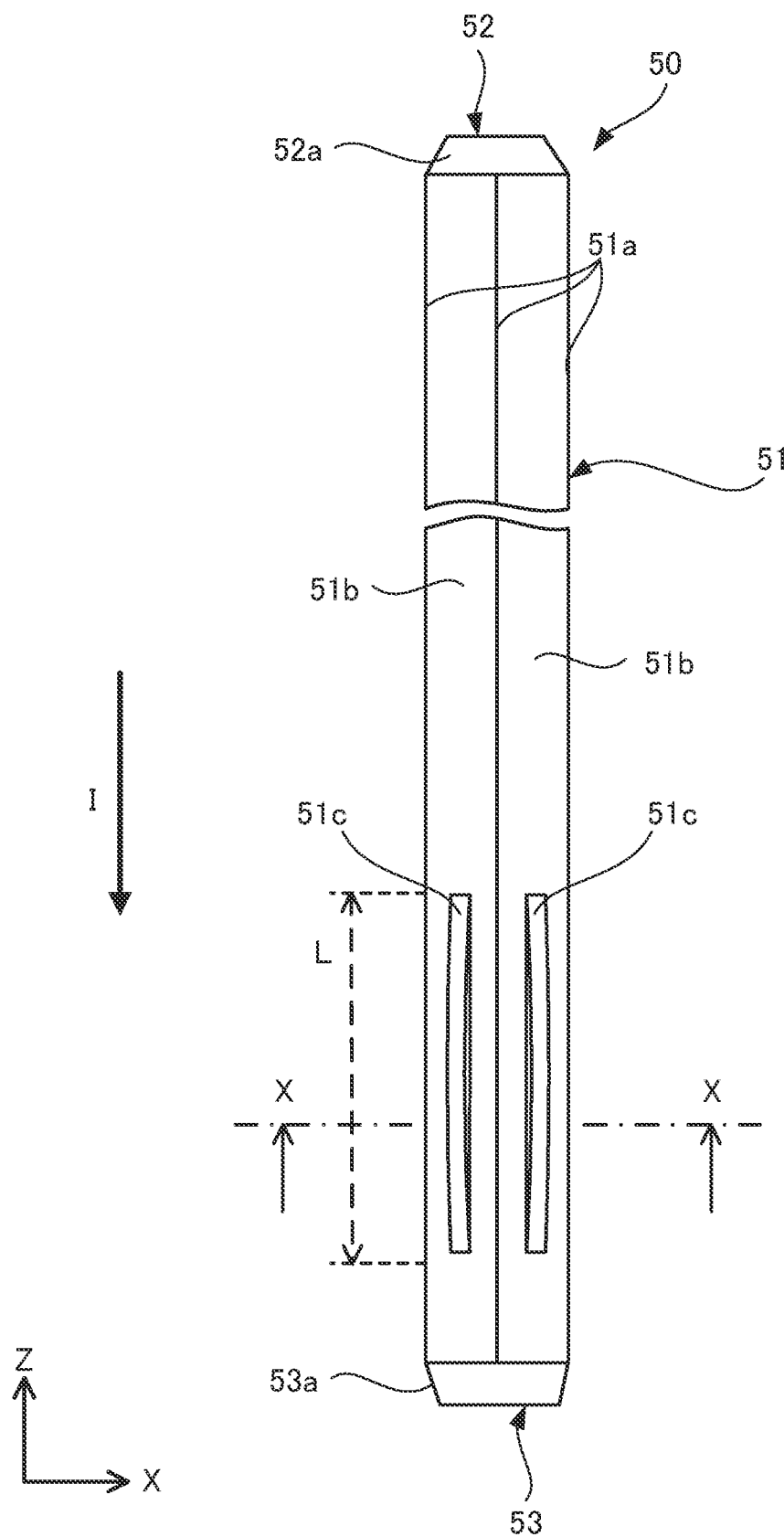
FIG. 4 depicts an external connection terminal included in the semiconductor device according to the first embodiment.
Figure 5:
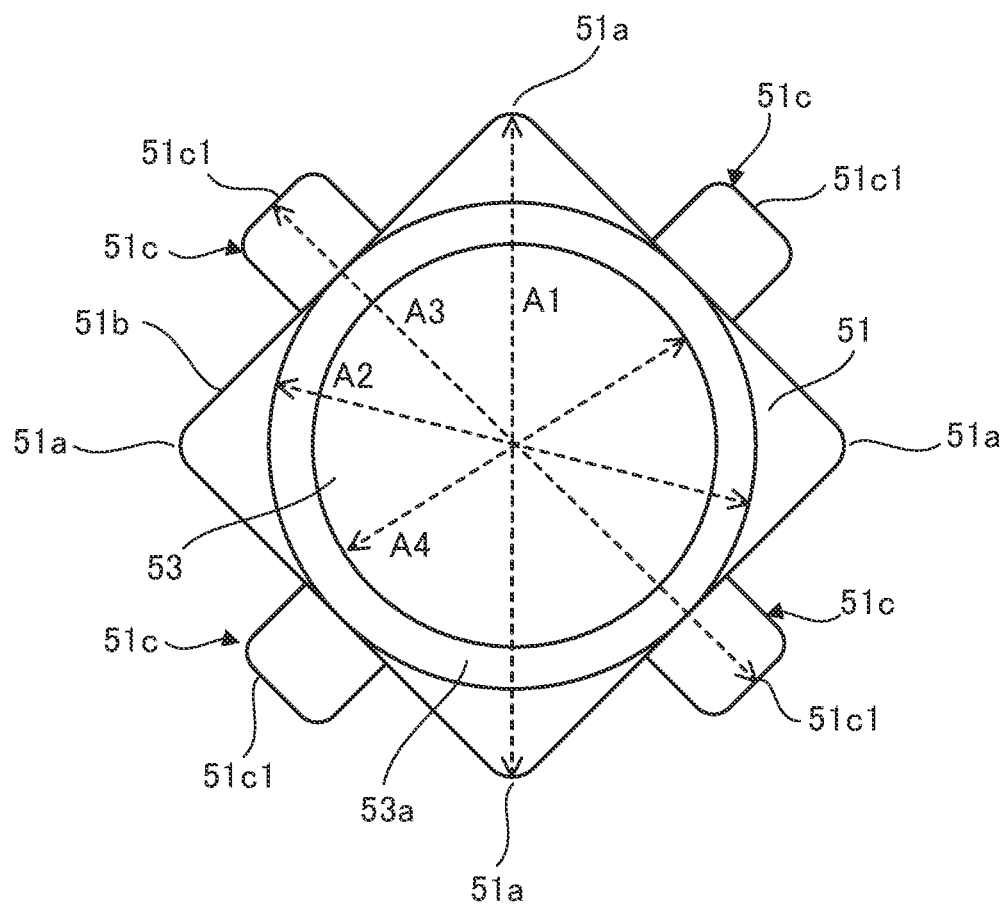
FIG. 5 is a sectional plan view depicting an external connection terminal included in the semiconductor device according to the first embodiment.

Next, the external connection terminals 50 included in the semiconductor device 1 will be described with reference to FIGS. 4 and 5. FIG. 4 depicts an external connection terminal included in the semiconductor device according to the first embodiment, and FIG. 5 is a sectional plan view depicting an external connection terminal included in the semiconductor device according to the first embodiment. Note that FIG. 5 is a cross-sectional view taken along a dot-dash line X-X in FIG. 4.

Each external connection terminal 50 includes a trunk portion 51 and tip portions 52 and 53. The "insertion direction I" for each external connection terminal 50 is a direction from the tip portion 52 toward the tip portion 53. The trunk portion 51 is formed as a prism (that is, a quadrangular prism). The trunk portion 51 is surrounded on four sides by four outer surface portions 51b, and includes four corner portions 51a where the outer surface portions 51b are joined. The four corner portions 51a are R-chamfered as depicted in FIG. 5. In the trunk portion 51, a length A1 between opposite corner portions 51a may be larger than the inner diameter B1 of the contact components 30 but not greater than 120% of the inner diameter B1. As one example, the length A1 may be at least 0.2 mm and not greater than 2.4 mm.

Protruding portions 51c are formed along the insertion direction I on the four outer surface portions 51b of the trunk portion 51. Each protruding portion 51c is formed at the center in the width direction (which is perpendicular to the insertion direction I) of the outer surface portion 51b. That is, each protruding portion 51c is provided with a sliding surface 51c1 that is slim and extends along the insertion direction I. The length L in the insertion direction I of each protruding portion 51c is shorter than the height H1 of each contact component 30. It is preferable for the length L of each protruding portion 51c to be at least 30% but not greater than 80% of the height H1 of the contact components 30. As one example, the length L is at least 0.6 mm but not greater than 16 mm. This means that when an external connection terminal 50 has been inserted into a contact component 30, the tip portion 53-side end of the protruding portion 51c becomes positioned, when looking from the side, at a position displaced from the open end portion 31c2 toward the open end portion 31c1. In the same way, the tip portion 52-side end of the protruding portion 51c becomes positioned, when looking from the side, at a position displaced from the open end portion 31c1 toward the open end portion 31c2. More specifically, the tip portion 53-side end and tip portion 52-side end of the protruding portion 51c are positioned, when looking from the side, between the open end portion 31c2 and the open end portion 31c1. Note that the external connection terminal is inserted in the contact component 30 without the tip portion 53 sticking out of the open end portion 31c2.

Each protruding portion 51c is formed so that a height from the outer surface portion 51b decreases in the insertion direction I toward at least the tip portion 53 side. Note that in the example depicted in FIG. 4, the height of the protruding portion 51c from the outer surface portion 51b also decreases toward the tip portion 52 side. That is, the protruding portion 51c has a curved shape so as to trace a gradual arch. Note that the highest point of the sliding surface 51c1 of the protruding portion 51c may be the center in the insertion direction I of the sliding surface 51c1, or may be displaced from the center toward either of the tip portions 52 and 53.

In the same way as the trunk portion 51, corner portions on both sides in the width direction of each sliding surface 51c1 of a protruding portion 51c are R-chamfered as depicted in FIG. 5. A length A3 between parts of opposite sliding surfaces 51c1 where the height from the outer surface portion 51b is the greatest is for example at least 0.2 mm but not greater than 2.4 mm. The length A3 between the protruding portions (protrusions) 51c is formed so as to be substantially equal to the length A1. The length A3 may be the same as the length A1, which is between the opposite corner portions 51a, or may be at least 90% but not greater than 110% of the length A1. The length A3 between the sliding surfaces 51c1 may be larger than the inner diameter B1 of the contact components 30 but not greater than 120% of the inner diameter B1. The trunk portion 51 on which the protruding portions 51c are formed may be formed by a drawing process, for example. A die including a die hole in which molds corresponding to the protruding portions 51c are formed is used. The protruding portions 51c formed on the outer surface portions 51b of the trunk portion 51 that has been pulled from a die hole are cut and polished to complete the protruding portions 51c on the trunk portion 51. As depicted in FIG. 5, each protruding portion 51c is formed in a rectangular shape. The protruding portions 51c are not limited to rectangular shapes, and the sliding surfaces 51c1 may be hill-shaped. The protruding portions 51c may also be triangular.

The tip portions 52 and 53 are provided at the two ends of the trunk portion 51. The tip portions 52 and each have a truncated cone shape. That is, the tip portions 52 and 53 are provided with tapered surfaces 52a and 53a that form side surfaces whose diameter decreases in the up-down direction of the external connection terminal 50. In addition, a diameter A4 at a front end surface (that is, the upper surface) of each of the tip portions 52 and 53 is shorter than a diameter A2 of a base surface that faces each upper surface. The tip portions 52 and 53 may be thermally or adhesively joined or welded to both ends of the trunk portion 51. Alternatively, the tip portions 52 and 53 may be formed by machining, for example, grinding, lathing, or cutting, both ends of the trunk portion 51.

Figure 6:
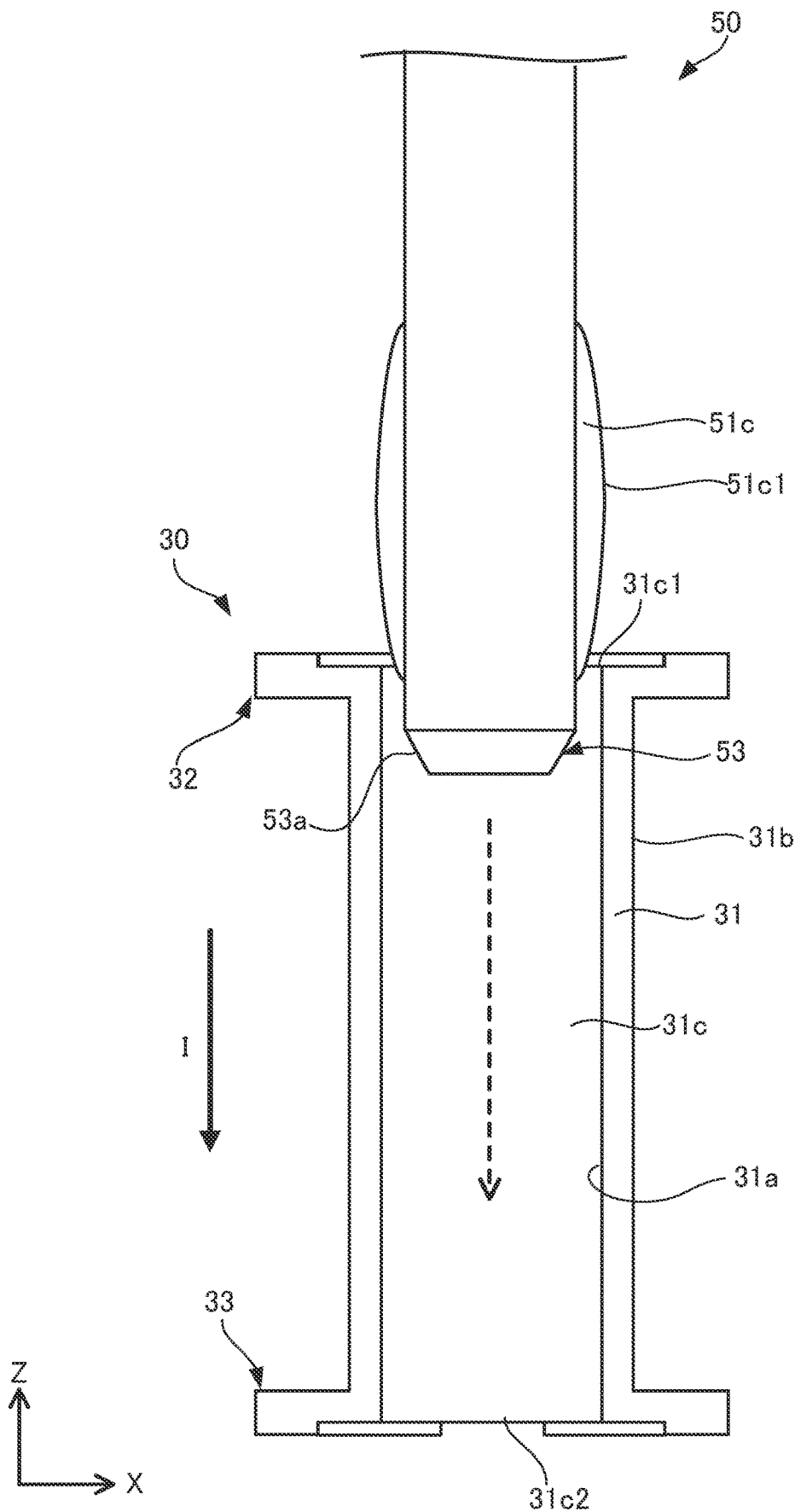
FIG. 6 is a sectional side view before press fitting of an external connection terminal into a contact component included in the semiconductor device according to the first embodiment.
Figure 7:
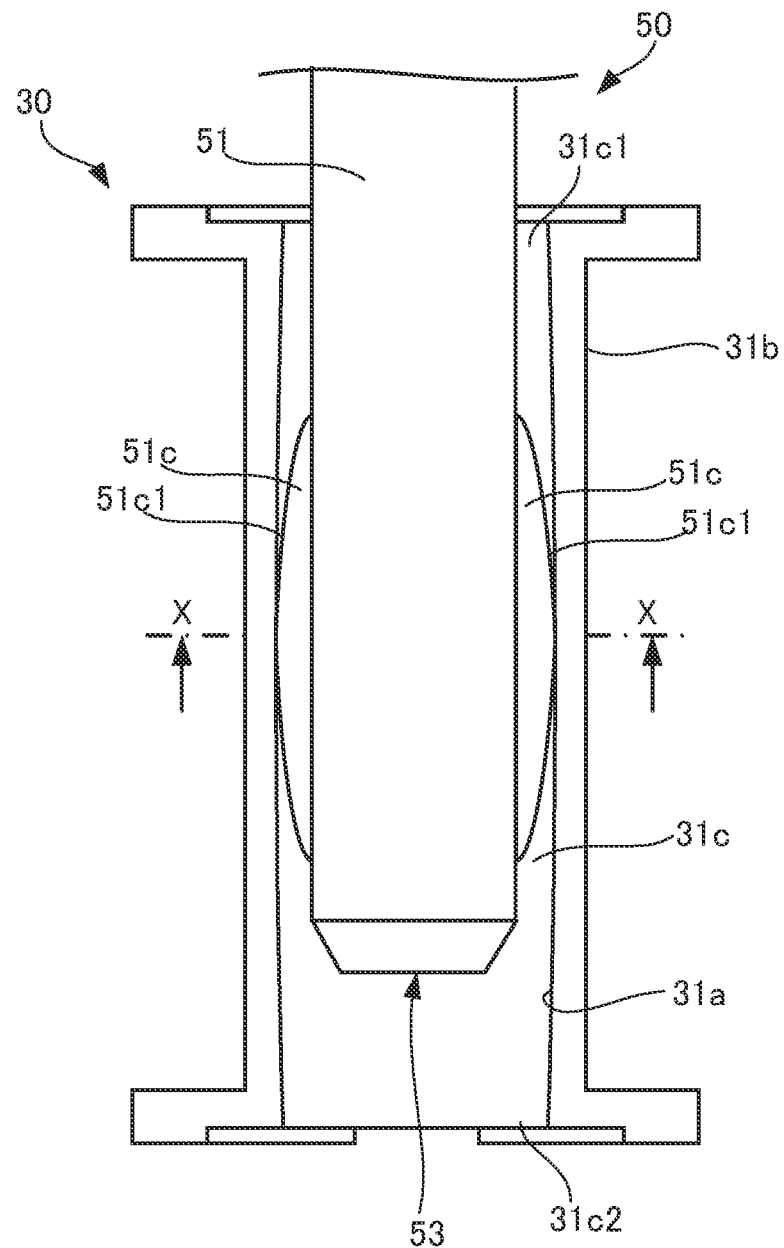
FIG. 7 is a sectional side view after press fitting of the external connection terminal into the contact component included in the semiconductor device according to the first embodiment.
Figure 8:
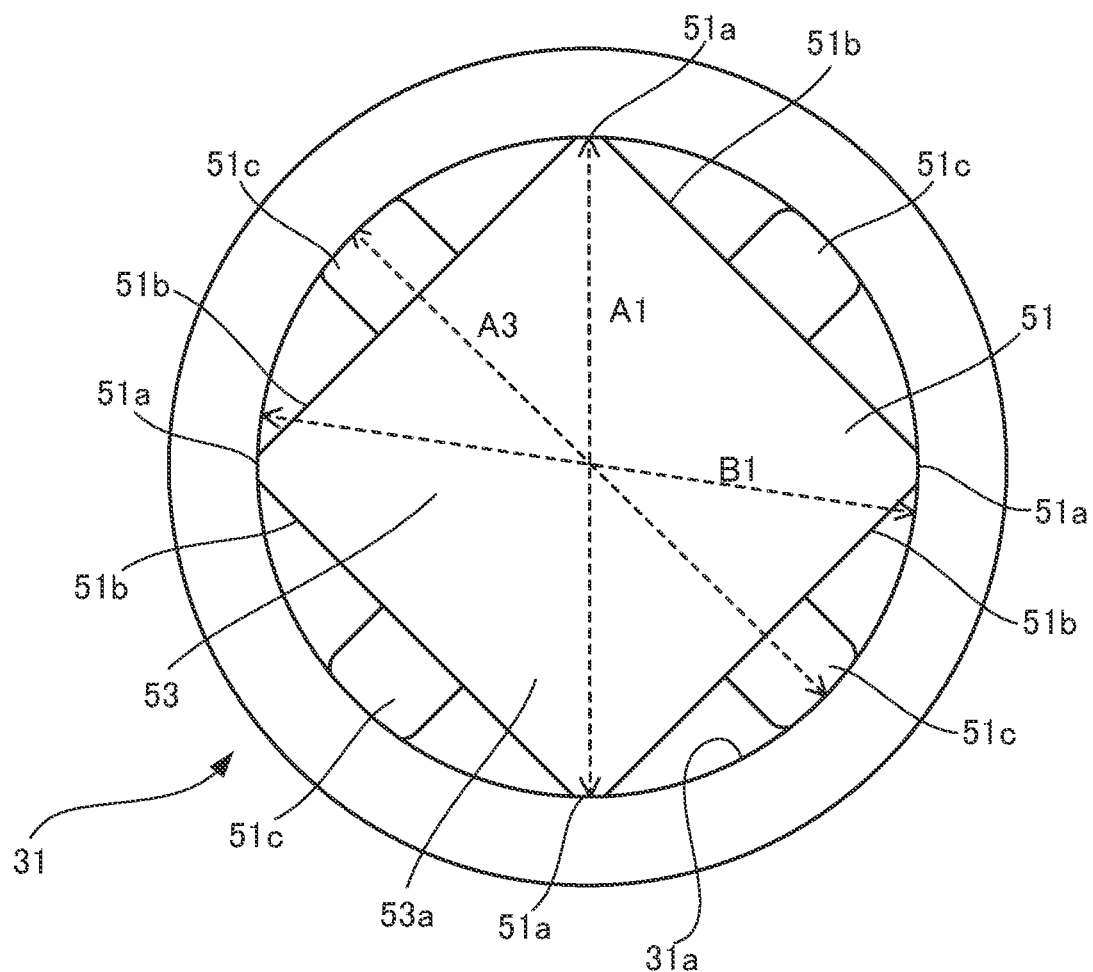
FIG. 8 is a first sectional plan view after press fitting of the external connection terminal into the contact component included in the semiconductor device according to the first embodiment.
Figure 9:
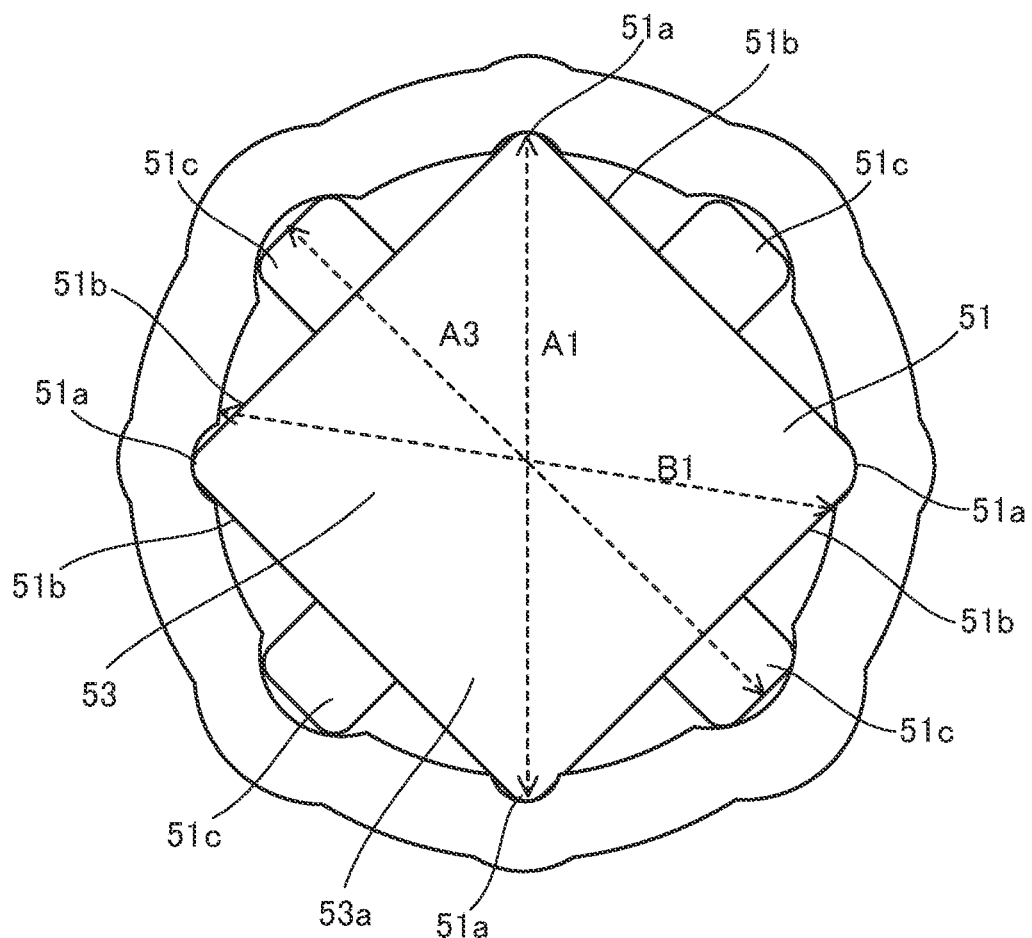
FIG. 9 is a second sectional plan view after press fitting of the external connection terminal into the contact component included in the semiconductor device according to the first embodiment.
Figure 9:
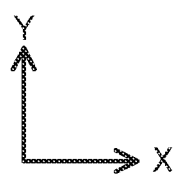

Next, press-fitting of the external connection terminals 50 into the contact components 30 will be described with reference to FIGS. 6 to 9. FIG. 6 is a sectional side view before press fitting of an external connection terminal into a contact component included in the semiconductor device according to the first embodiment, and FIG. 7 is a sectional side view after press fitting of the external connection terminal into the contact component included in the semiconductor device according to the first embodiment. FIG. 8 and FIG. 9 are sectional plan views after press fitting of the external connection terminal into the contact component included in the semiconductor device according to the first embodiment. Note that the circuit patterns 12 provided with the contact components 30 have been omitted from FIGS. 6 and 7. In FIGS. 6 and 7, reference numerals have been assigned to the component elements being described here. FIGS. 8 and 9 are cross-sectional views taken along a dot-dash line X-X in FIG. 7.

First, as depicted in FIG. 6, each external connection terminal 50 is inserted from the tip portion 53 into the open end portion 31c1 of the through hole 31c of a contact component 30. When doing so, since the tip portion 53 is formed with the tapered surface 53a, the tip portion 53 is capable of being easily inserted into the open end portion 31c1 of the through hole 31c. After this, the external connection terminal 50 is further inserted along the insertion direction I toward the open end portion 31c2. On the external connection terminal 50, the sliding surfaces 51c1 of the protruding portions 51c are curved. This means that the protruding portions 51c of the external connection terminal 50 advance in the insertion direction I while sliding through the through hole 31c. At this time also, the corner portions 51a of the external connection terminal 50 also advance in the insertion direction I while sliding through the through hole 31c.

After this, when the protruding portions 51c have advanced in the insertion direction I while sliding on the inner circumferential surface 31a of the through hole 31c, the parts on the sliding surfaces 51c1 of the protruding portions 51c with the greatest height from the outer surface portions 51b will fit into the inner circumferential surface 31a of the through hole 31c. At this point, the external connection terminal 50 stops advancing in the insertion direction I into the through hole 31c. That is, at this time, as depicted in FIG. 8, the sliding surfaces 51c1 of the four protruding portions 51c of the trunk portion 51 will be pressed by the inner circumferential surface 31a of the through hole 31c. The four corner portions 51a of the trunk portion 51 are also pressed and crushed by the inner circumferential surface 31a of the through hole 31c. That is, the four corner portions 51a and the four protruding portions 51c of the trunk portion 51 make contact with the inner circumferential surface 31a of the through hole 31c. This increases the contact area with the inner circumferential surface 31a of the through hole 31c compared to a configuration with no protruding portions 51c. That is, in addition to the four corner portions 51a, the four protruding portions 51c of the trunk portion 51 are pressed by the inner circumferential surface 31a of the through hole 31c. This means that the external connection terminal 50 is securely fixed to the inner circumferential surface 31a of the through hole 31c of the contact component 30 through press-fitting of the protruding portions 51c in addition to the corner portions 51a.

When the external connection terminal 50 has been inserted into and fixed to the contact component 30 as described above, as depicted in FIG. 8, the dimensions at the position where the external connection terminal 50 is fitted into the contact component 30 are such that the length A3≈the length A1>the inner diameter B1. Since the contact components 30 and the external connection terminals 50 have the above dimensions, the four corner portions 51a and the four protruding portions 51c of the external connection terminals 50 will contact the inner circumferential surface 31a of the through hole 31c, resulting in the four corner portions 51a and the four protruding portions 51c being pressed by and fixed to the inner circumferential surface 31a. This means that when the printed circuit board 60 is attached to the external connection terminals 50, it is possible to prevent the external connection terminals 50 from being excessively inserted into the contact components 30. This means that a constant insertion force is ensured when the external connection terminals 50 are inserted into the contact components 30. Accordingly, by pressing the external connection terminals 50 into the contact components 30 with a constant insertion force, the external connection terminals 50 is capable of being reliably press-fitted into the contact components 30, and the heights of the external connection terminals 50 may be made uniform. By doing so, it is possible to securely and safely attach the printed circuit board to the external connection terminals 50 of the semiconductor device 1, which makes it possible to reduce the occurrence of damage to the semiconductor device 1.

Note that in the configuration described above, the length A3≈the length A1 may be larger than the inner diameter B1, or depending on the materials of the external connection terminals 50 and the contact components 30, as depicted in FIG. 9, regions of the main body portion 31 of each contact component 30 that correspond to the four corner portions 51a and the four protruding portions 51c of the external connection terminal 50 may bulge outward. That is, parts of the outer circumferential surface 31b of the main body portion 31 of a contact component 30 corresponding to the four corner portions 51a and the protruding portions 51c of the external connection terminal 50 that has been inserted into the through hole 31c bulge outward from the other parts. With this configuration also, in the same way as in FIG. 8, the four corner portions 51a and the four protruding portions 51c of the external connection terminal 50 contact the inner circumferential surface 31a of the through hole 31c, so that the four corner portions 51a and the four protruding portions 51c are pressed by and fixed to the inner circumferential surface 31a. This means that when the printed circuit board 60 is attached to the external connection terminals 50, it is possible to prevent the external connection terminals 50 from being excessively inserted into the contact components 30.

The semiconductor device 1 described above includes: the circuit patterns 12; the contact components 30 in which the cylindrical through holes 31c are formed, which each include a main body portion 31 with the first open end portion 31c2 and the second open end portion 31c1, and which each have the first open end portion 31c2 joined to a circuit pattern 12; and the external connection terminals 50 that are formed as quadrangular prisms including four outer surface portions 51b extending in the insertion direction I and are inserted into the contact components 30 so that the four corner portions 51a are pressed by the inner circumferential surfaces 31a of the through holes 31c. In addition, the protruding portions 51c are formed on each of the four outer surface portions 51b of each external connection terminal 50, with the protruding portions 51c being pressed against the inner circumferential surfaces 31a of the through holes 31c. This means that in addition to the four corner portions 51a, the protruding portions 51c of each external connection terminal 50 also contact the inner circumferential surface 31a of a through hole 31c, so that the four corner portions 51a and the protruding portions 51c are pressed by and fixed to the inner circumferential surface 31a. As a result, when the printed circuit board 60 is attached to the external connection terminals 50, it is possible to prevent the external connection terminals 50 from being excessively inserted into the contact components 30.

To increase the contact area with the inner circumferential surfaces 31a of the through holes 31c, it is preferable to provide the protruding portions 51c formed on the external connection terminals 50 on at least one pair of opposing outer surface portions 51b out of the four outer surface portions 51b of the trunk portion 51. This will result in the opposing outer surface portions 51b out of the four outer surface portions 51b of the trunk portion 51 being clamped by the inner circumferential surface 31a of the through hole 31c. The protruding portions 51c are not limited to a slim shape that extends along the insertion direction I on the outer surface portions 51b. As another configuration, the protruding portions 51c may be formed as individual hemispherical shapes on the outer surface portions 51b of the trunk portion 51. Also, by making the width (in a direction perpendicular to the insertion direction I) of the protruding portions 51c wider than the configuration depicted in FIG. 8 to increase the contact area with the inner circumferential surface 31a of the through hole 31c, it is possible to fix the external connection terminals 50 to the through holes 31c more securely.

Second Embodiment

Figure 10A:
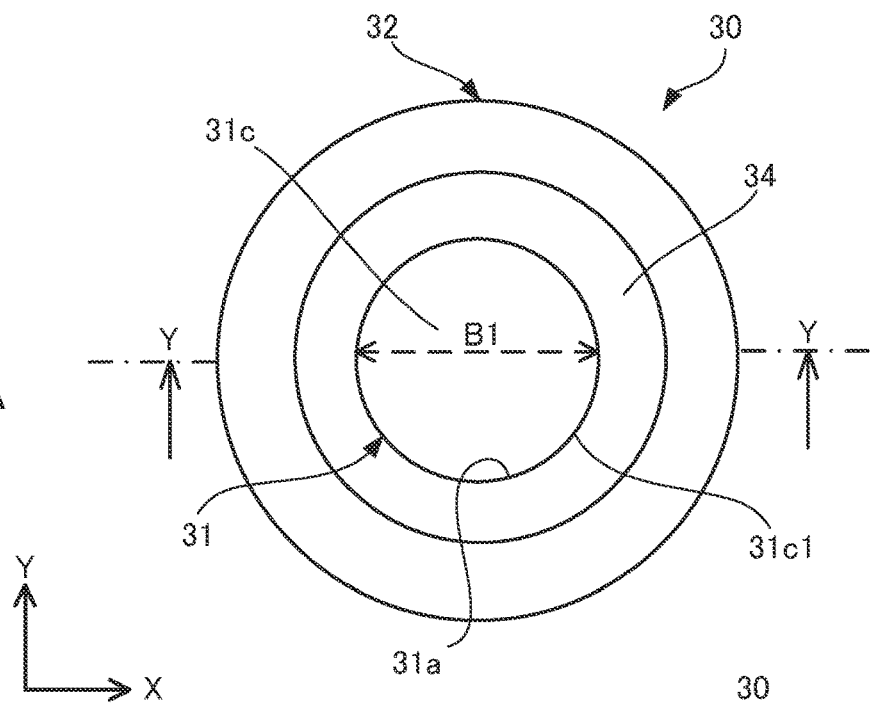
FIGS. 10A and 10B depict a contact component included in a semiconductor device according to a second embodiment.
Figure 10B:
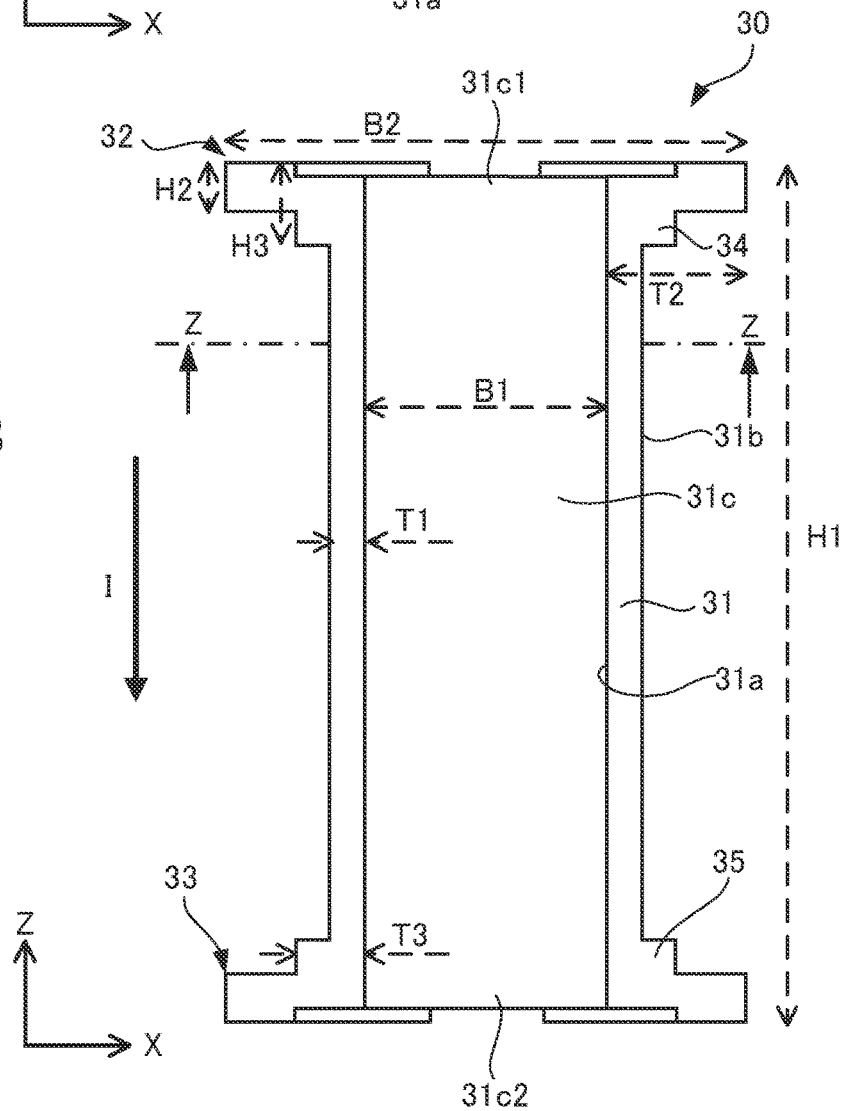
Figure 11:
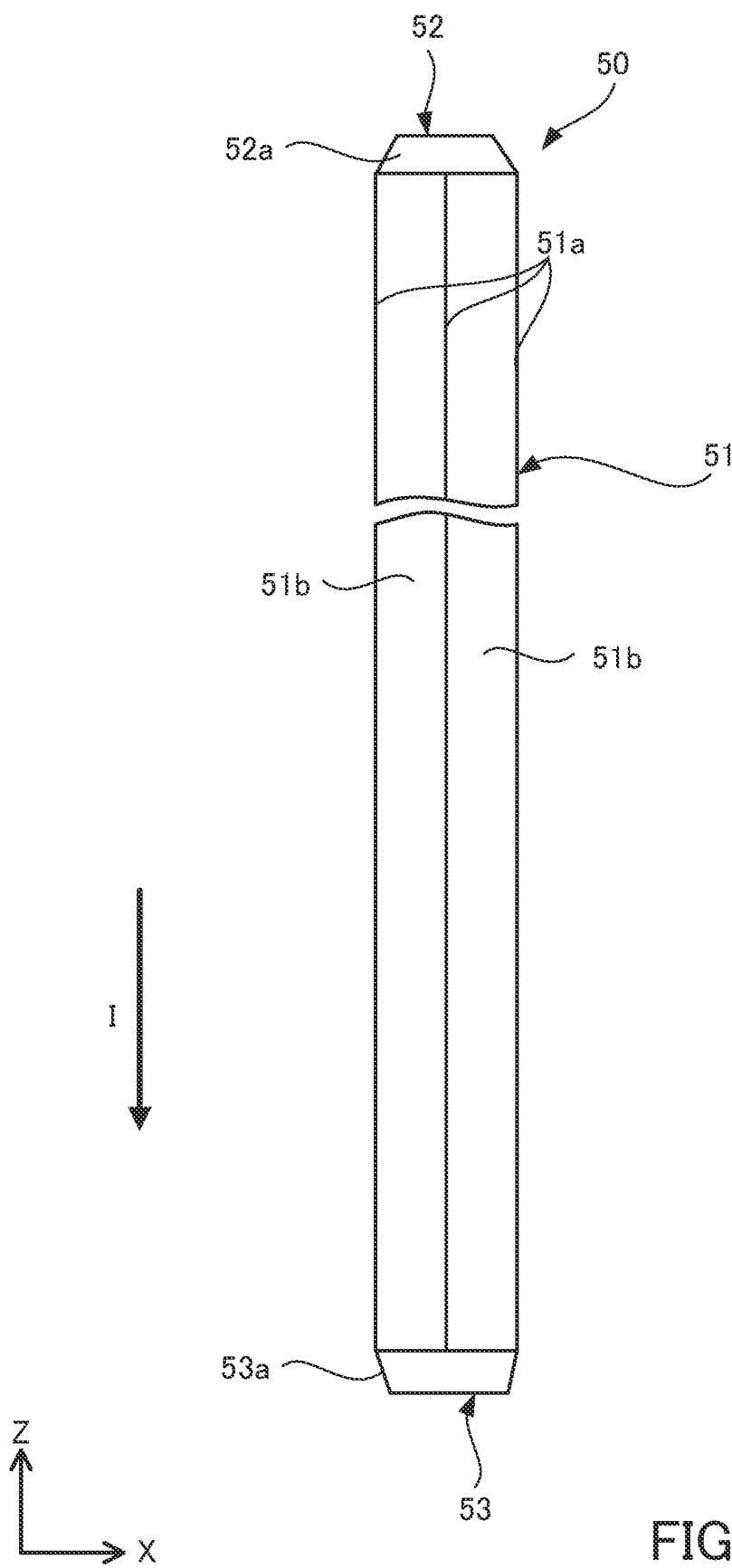
FIG. 11 depicts an external connection terminal included in the semiconductor device according to the second embodiment.

The second embodiment achieves the same effect as the first embodiment by adding a new configuration to the contact components 30, not to the external connection terminals 50 as in the first embodiment. Note that the external connection terminals 50 and the contact components 30 according to the second embodiment will be described focusing on the differences with the external connection terminals 50 and the contact components 30 according to the first embodiment. Aside from the contact components and the external connection terminals, the other parts of the semiconductor device 1 may be adopted in this second embodiment. FIGS. 10A and 10B depict a contact component included in a semiconductor device according to the second embodiment. FIG. 11 depicts an external connection terminal included in the semiconductor device according to the second embodiment. Note that FIG. 10A is a cross-sectional view taken along a dot-dash line Z-Z in FIG. 10B and FIG. 10B is a cross-sectional view taken along a dot-dash line Y-Y in FIG. 10A.

In the same way as in the first embodiment, the contact components 30 in the second embodiment depicted in FIGS. 10A and 10B are equipped with the main body portion 31 and the flanges 32 and 33 provided at the open end portion 31c1 and the open end portion 31c2 respectively of the main body portion 31. The dimensions are also the same as the main body portion 31 and the flanges 32 and 33 in the first embodiment. The contact components 30 in the second embodiment are additionally equipped with reinforcing portions 34 and 35. The reinforcing portions 34 and 35 are flared outward (on an XY plane) from other regions of the main body portion 31 at at least one of the second open end portion 31c1 and the first open end portion 31c2 of the main body portion 31, and are thickly formed in ring shapes along the circumferential direction. The reinforcing portions 34 and 35 are connected to the flanges 32 and 33 along the circumferential direction as well as to the main body portion 31 at the open end portions 31c1 and 31c2. Note that in the second embodiment, a reinforcing portion (34 or 35) is formed at each of the open end portions (31c1 or 31c2). Note that a height H3 in the Z direction of the reinforcing portions 34 and 35 is at least 10% but not greater than 30% of the height H1 of the contact component 30. As one example, the height H3 is at least 0.2 mm but not greater than 6.0 mm. A thickness T3 in the XY plane of the reinforcing portions 34 and 35 is larger than the thickness T1 of the main body portion 31 and smaller than the width T2 of the flanges 32 and 33. It is preferable for the thickness T3 of the reinforcing portions 34 and 35 to be at least 150% of the thickness T1 of the main body portion 31 but not greater than 80% of the width T2 of the flanges 32 and 33. As one example, the thickness T3 is at least 75 μm but not greater than 1.6 mm.

The difference between the flanges 32 and 33 and the reinforcing portions 34 and 35 formed on the contact components 30 will now be described. The flanges and 33 prevent a contact component 30 from falling over when the contact component 30 is joined to a circuit pattern 12 using a joining member. Providing the flanges and 33 on the contact component 30 also makes it possible to increase the area of the joint between the contact component 30 and the circuit pattern 12, which improves the joint strength between the contact components 30 and the circuit patterns 12. In order for the flanges 32 and 33 to achieve this function, the outer diameter B2 may be at least 50% of the height H1 of the contact component 30. In addition, the width T2 of the flanges 32 and 33 may be at least 2.5 times the thickness T1 of the main body portion 31 of the contact component 30. The flanges 32 and 33 are formed from the cylindrical main body portion 31 by press machining. This means the height H2 of the flanges is smaller than the thickness T1 of the main body portion 31. Accordingly, at the flanges 32 and 33, the height H2 is less than 0.4 times the width T2.

On the other hand, by forming the reinforcing portions 34 and 35 at the open end portions 31c1 and 31c2 on (the main body portion 31 of) a contact component 30, it is possible to reinforce the open end portions 31c1 and 31c2 of the main body portion 31 and prevent expansion. This means that when an external connection terminal 50 is inserted into a contact component 30 on which the reinforcing portions 34 and 35 have been formed, a higher pressing force will be exerted on the external connection terminal 50 at the positions of the reinforcing portions 34 and 35 of the contact component than at other positions. The thickness T3 of the reinforcing portions 34 and 35 need to be at least 1.1 times but not greater than 2.5 times the thickness T1 of the main body portion 31, and preferably at least 1.5 times but not greater than 2.0 times the thickness T1.

The height H3 of the reinforcing portions 34 and 35 need to be larger than the thickness T1 of the main body portion 31 and at least 0.5 times but not greater than 4.0 times their own thickness T3.

Accordingly, the flanges 32 and 33 need to have the smallest possible height H2 and the greatest possible width T2. On the other hand, it is sufficient for the reinforcing portions 34 and 35 to have a somewhat smaller thickness T3 than the width T2 of the flanges 32 and 33. The height H3 need to be sufficiently larger than the height H2 of the flanges 32 and 33, and also larger than the thickness T1.

In the same way as in the first embodiment, the external connection terminals 50 of the second embodiment depicted in FIG. 11 each include the prismatic trunk portion 51 and the truncated cone-shaped tip portions 52 and 53. The dimensions are also the same as the trunk portion 51 and the tip portions 52 and 53 of the first embodiment. However, in the second embodiment, the protruding portions 51c are not provided on a pair of opposing outer surface portions 51b of the trunk portion 51. Also in the second embodiment, the length A1 of the external connection terminals 50 is several percent larger than the inner diameter B1 of the through holes 31c.

Figure 12:
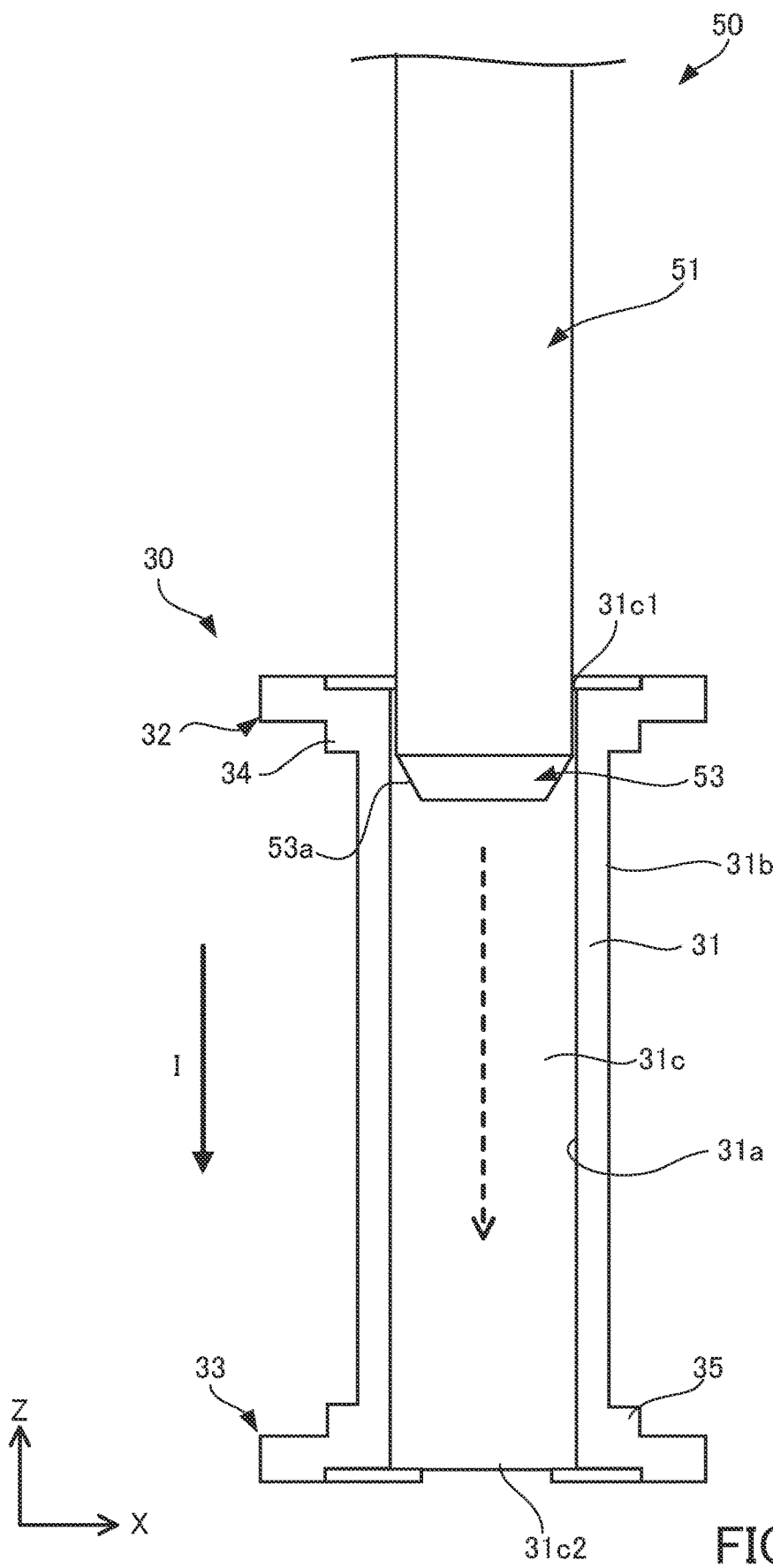
FIG. 12 is a sectional side view before press fitting of an external connection terminal into a contact component included in the semiconductor device according to the second embodiment.
Figure 13:
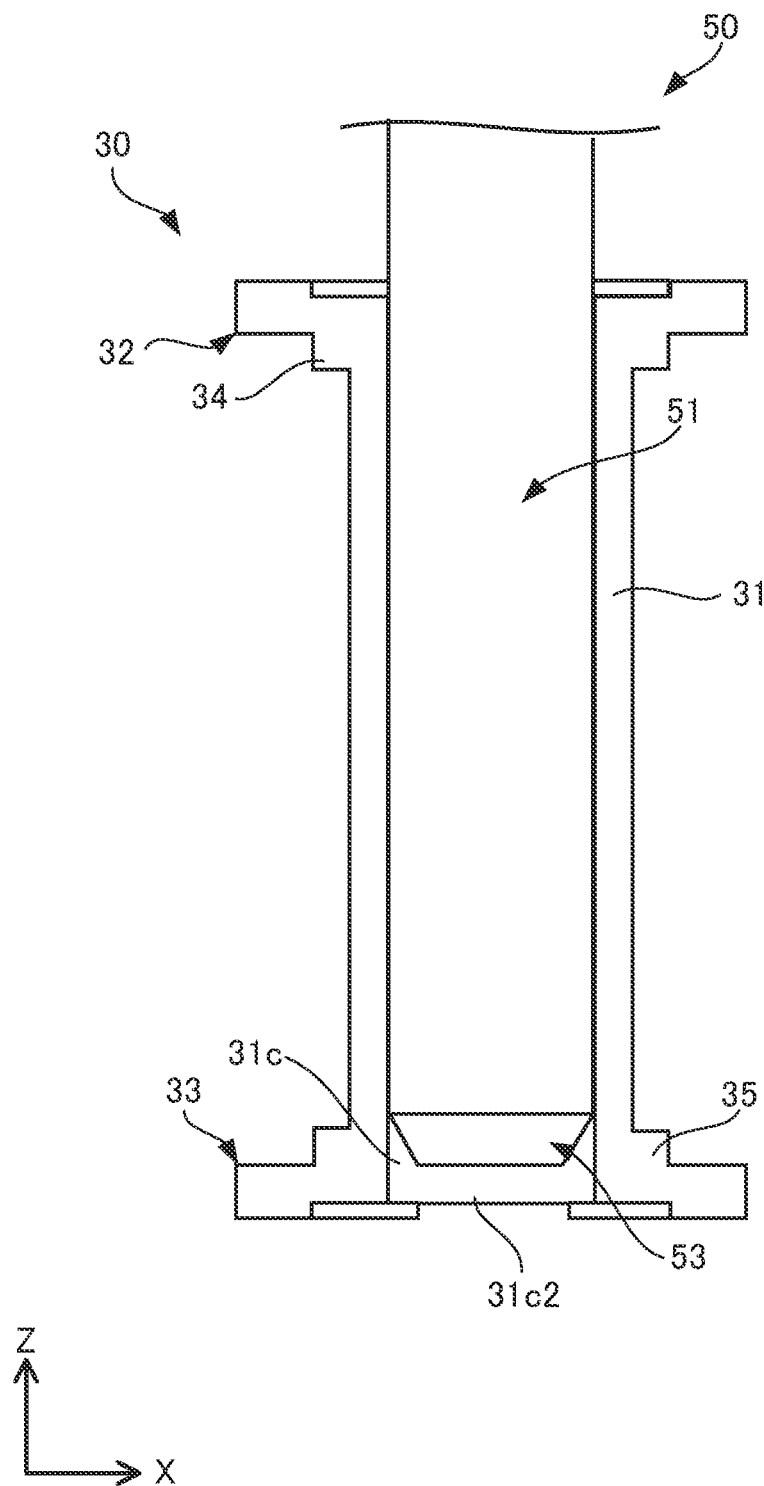
FIG. 13 is a sectional side view after press fitting of the external connection terminal into the contact component included in the semiconductor device according to the second embodiment.

Next, press-fitting of the external connection terminals 50 into the contact components 30 described above will be described with reference to FIGS. 12 and 13. FIG. 12 is a sectional side view before press fitting of an external connection terminal into a contact component included in the semiconductor device according to the second embodiment, and FIG. 13 is a sectional side view after press fitting of the external connection terminal into the contact component included in the semiconductor device according to the second embodiment. In FIGS. 12 and 13, reference numerals have been assigned to the component elements being described here.

First, in the same way as the first embodiment, the external connection terminals 50 are inserted from the tip portions 53 into the open end portions 31c1 of the through holes 31c of the contact components 30 (see FIG. 6). When doing so, since each tip portion 53 is formed with a tapered surface 53a, the tip portion 53 may be easily inserted into the open end portion 31c1 of a through hole 31c. The external connection terminal 50 is then further inserted toward the open end portion 31c2.

The reinforcing portion 34 is formed at the open end portion 31c1 side of the contact component 30. The length A1 of the external connection terminal 50 is longer than the inner diameter B1 of the through hole 31c. This makes it difficult for the external connection terminal 50 to enter the open end portion 31c1 of the through hole 31c, which prevents expansion of the open end portion 31c1. This means that in order to insert the external connection terminal 50 in the insertion direction I into the through hole 31c, the external connection terminal 50 is pressed with a larger insertion force than with a configuration where the reinforcing portion 34 is not provided. The four corner portions 51a of the external connection terminal 50 that are inserted into the through hole 31c are inserted from a region corresponding to the reinforcing portion 34 of the through hole 31c while being pressed more strongly.

The external connection terminal 50 is further pressed into the through hole 31c along the insertion direction I. The four corner portions 51a of the external connection terminal 50 advance further in the insertion direction I by sliding and being pressed against the inner circumferential surface 31a of the through hole 31c. The tip portion 53 of the external connection terminal 50 then reaches a position just before the open end portion 31c2 of the through hole 31c. Since the reinforcing portion 35 is formed on the open end portion 31c2 side of the through hole 31c, the part of the through hole 31c corresponding to the reinforcing portion 35 will resist expansion. This means that the insertion force for pressing the external connection terminal 50 further along the insertion direction I increases. When the tip portion 53 of the external connection terminal 50 has fitted into the region corresponding to the reinforcing portion 35 of the through hole 31c, as depicted in FIG. 13, the tip portion 53 of the external connection terminal 50 is clamped and restrained by the reinforcing portion 35. This means that when the printed circuit board 60 is attached to the external connection terminals 50, it is possible to prevent the external connection terminals 50 from being excessively inserted into the contact components 30.

The semiconductor device described above includes: the circuit patterns 12; the contact components in which cylindrical through holes 31c are formed, which are equipped with a main body portion 31, including a second open end portion 31c1 and a first open end portion 31c2, and a flange 33 formed at at least the first open end portion 31c2 of the main body portion 31, and which has the first end portion 31c2 joined to a circuit pattern 12; and external connection terminals 50 that are formed as prisms extending in the insertion direction I and are inserted into the contact components 30 with the corner portions 51a pressed against the inner circumferential surface 31a of the through holes 31c. In addition, the contact components 30 of the semiconductor device 1 each have thick, ring-shaped reinforcing portions 35 and 34 formed along the circumferential direction so as to be flared further outward than the other regions of the main body portion 31 at at least one of the first open end portion 31c2 and the second open end portion 31c1 of the main body portion 31. This means that when an external connection terminal 50 is inserted into the through hole 31c with the four corner portions 51a in contact with the inner circumferential surface 31a of the through hole 31c, the external connection terminal 50 will be pressed and fixed by the reinforcing portion 35 at the open end portion 31c2 side. As a result, when the printed circuit board 60 is attached to the external connection terminals 50, it is possible to prevent the external connection terminals 50 from being excessively inserted into the contact components 30.

Various modifications to the reinforcing portions 34 and 35 are described below.

First Modification

Figure 14:
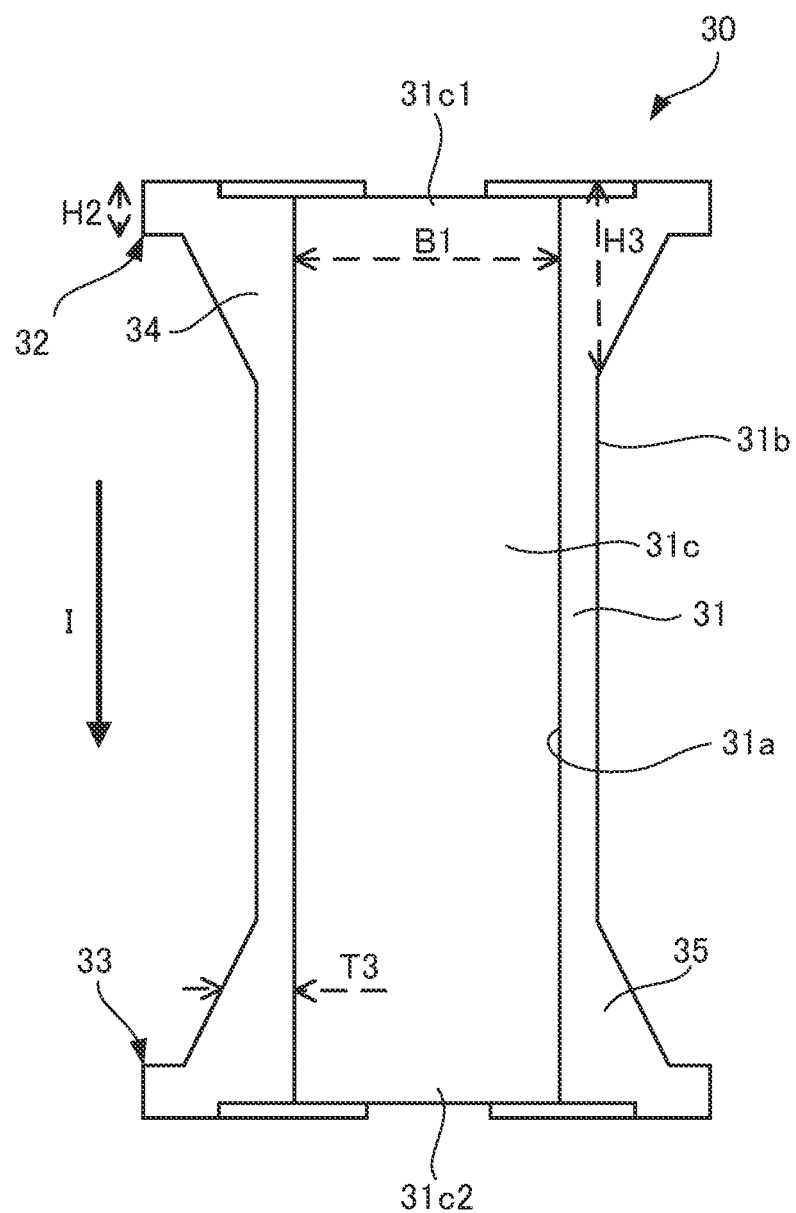
FIG. 14 depicts a contact component included in a semiconductor device according to a first modification to the second embodiment.

Contact components 30 according to a first modification will now be described with reference to FIG. 14. FIG. 14 depicts a contact component included in a semiconductor device according to a first modification to the second embodiment. Note that FIG. 14 corresponds to FIG. 10B. Refer to FIG. 10A for a cross-sectional view of the contact component 30 in FIG. 14. In the contact component 30 in FIG. 14, the thickness T3 of the reinforcing portion 34 formed on the contact component 30 in FIGS. 10A and 10B decreases from the open end portion 31c1 toward the open end portion 31c2, and the thickness T3 of the reinforcing portion 35 decreases from the open end portion 31c2 toward the open end portion 31c1.

As described earlier, the insertion force for pressing the external connection terminal 50 into the through hole 31c increases due to the reinforcing portions 34 and 35. The degree to which the through hole 31c resists expansion during insertion due to the presence of the reinforcing portions 34 and 35 depends on the thickness T3 of the reinforcing portions 34 and 35. As one example, the reinforcing portions 34 and 35 of the contact components 30 in FIGS. 10A and 10B have a uniform thickness T3. This means that when an external connection terminal 50 is inserted into the through hole 31c of the contact component 30 in FIGS. 10A and 10B, the external connection terminal 50 inserted into the regions corresponding to the reinforcing portions 34 and 35 will be uniformly pressed by the reinforcing portions 34 and 35.

On the other hand, with the contact component in FIG. 14, the thickness T3 of the reinforcing portion 34 decreases from the open end portion 31c1 toward the open end portion 31c2. This means that when an external connection terminal 50 is inserted into the through hole 31c of the contact component 30 in FIG. 14, the pressure exerted on the external connection terminal 50 by the reinforcing portion 34 is not uniform. That is, the pressure exerted on the external connection terminal 50 by the reinforcing portion 34 on the inner circumferential surface 31a decreases from the open end portion 31c1 toward the open end portion 31c2.

The thickness T3 of the reinforcing portion 35 increases from the open end portion 31c1 toward the open end portion 31c2. This means that the pressure exerted on an external connection terminal 50 from a region corresponding to the reinforcing portion 35 on the inner circumferential surface 31a increases from the open end portion 31c1 toward the open end portion 31c2.

When an external connection terminal 50 is pressed into the through hole 31c of a contact component along the insertion direction I, passes through the reinforcing portion 34, and enters the reinforcing portion 35, pressure that gradually increases in the insertion direction I is exerted on the external connection terminal 50 by the region corresponding to the reinforcing portion 35 of the inner circumferential surface 31a. This means that when an external connection terminal 50 is pressed into a contact component 30 with a constant insertion force, the external connection terminal 50 may be stably press-fitted. In particular, the external connection terminal 50 is capable of stably entering the region corresponding to the reinforcing portion 35 of the through hole 31c of the contact component 30. As a result, when the printed circuit board is attached to the external connection terminals 50, it is possible to prevent the external connection terminals 50 from being excessively inserted into the contact components 30.

Second Modification

Figure 15:
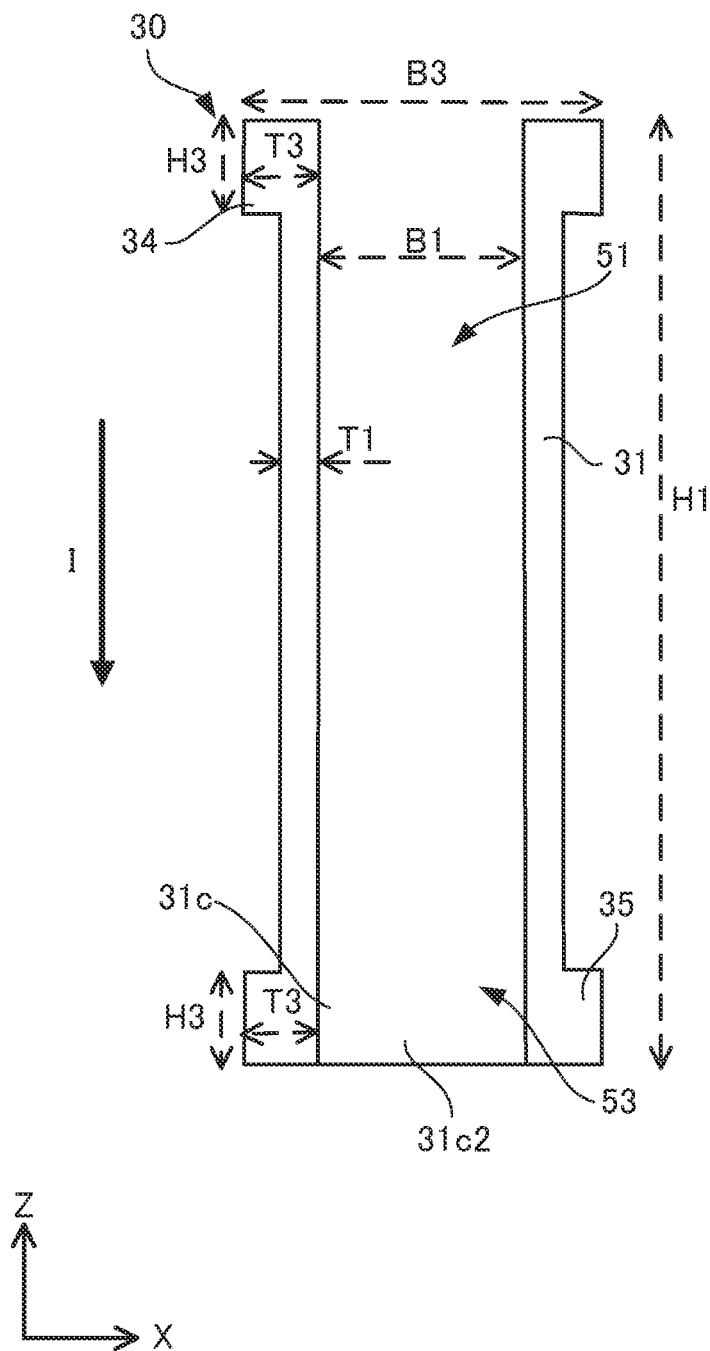
FIG. 15 depicts a contact component included in a semiconductor device according to a second modification to the second embodiment.

Contact components 30 according to a second modification will now be described with reference to FIG. 15. FIG. 15 depicts a contact component included in a semiconductor device according to a second modification to the second embodiment. Note that FIG. 15 corresponds to FIG. 10B. Refer to FIG. 10A for a cross-sectional view of the contact component 30 in FIG. 15. The contact component 30 in FIG. 15 omits the flanges 32 and 32 from the contact component 30 in FIGS. 10A and 10B.

With this configuration also, in the same way as the configuration in FIG. 8, when the external connection terminal 50 is inserted into the through hole 31c with the four corner portions 51a in contact with the inner circumferential surface 31a of the through hole 31c, the external connection terminal 50 will pressed by and fixed to the reinforcing portion 35 at the open end portion 31c2 side. As a result, when the printed circuit board 60 is attached to the external connection terminals 50, it is possible to prevent the external connection terminals 50 from being excessively inserted into the contact components 30.

Third Embodiment

Figure 16:
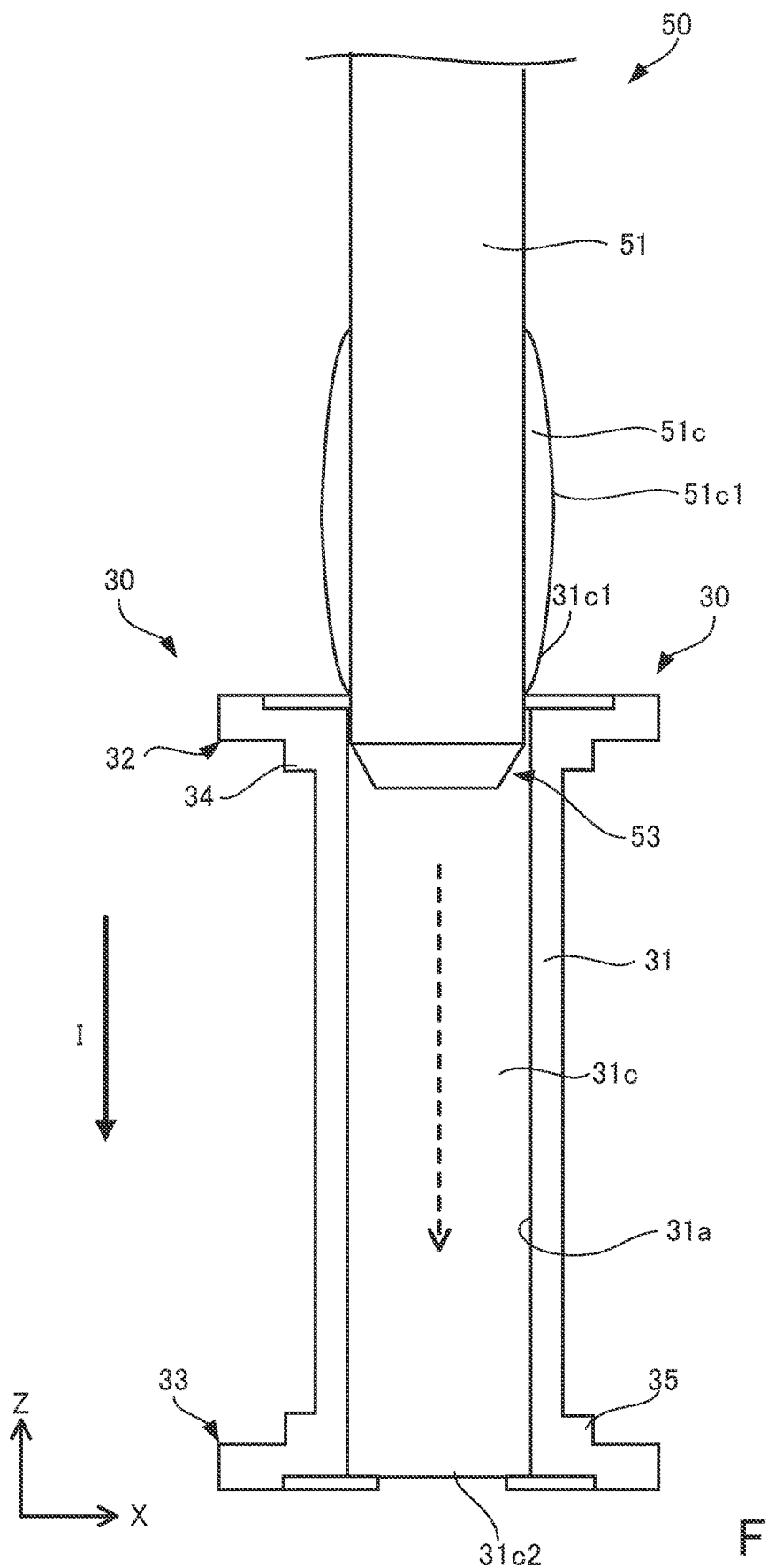
FIG. 16 is a sectional side view before press fitting of an external connection terminal into a contact component included in a semiconductor device according to a third embodiment.
Figure 17:
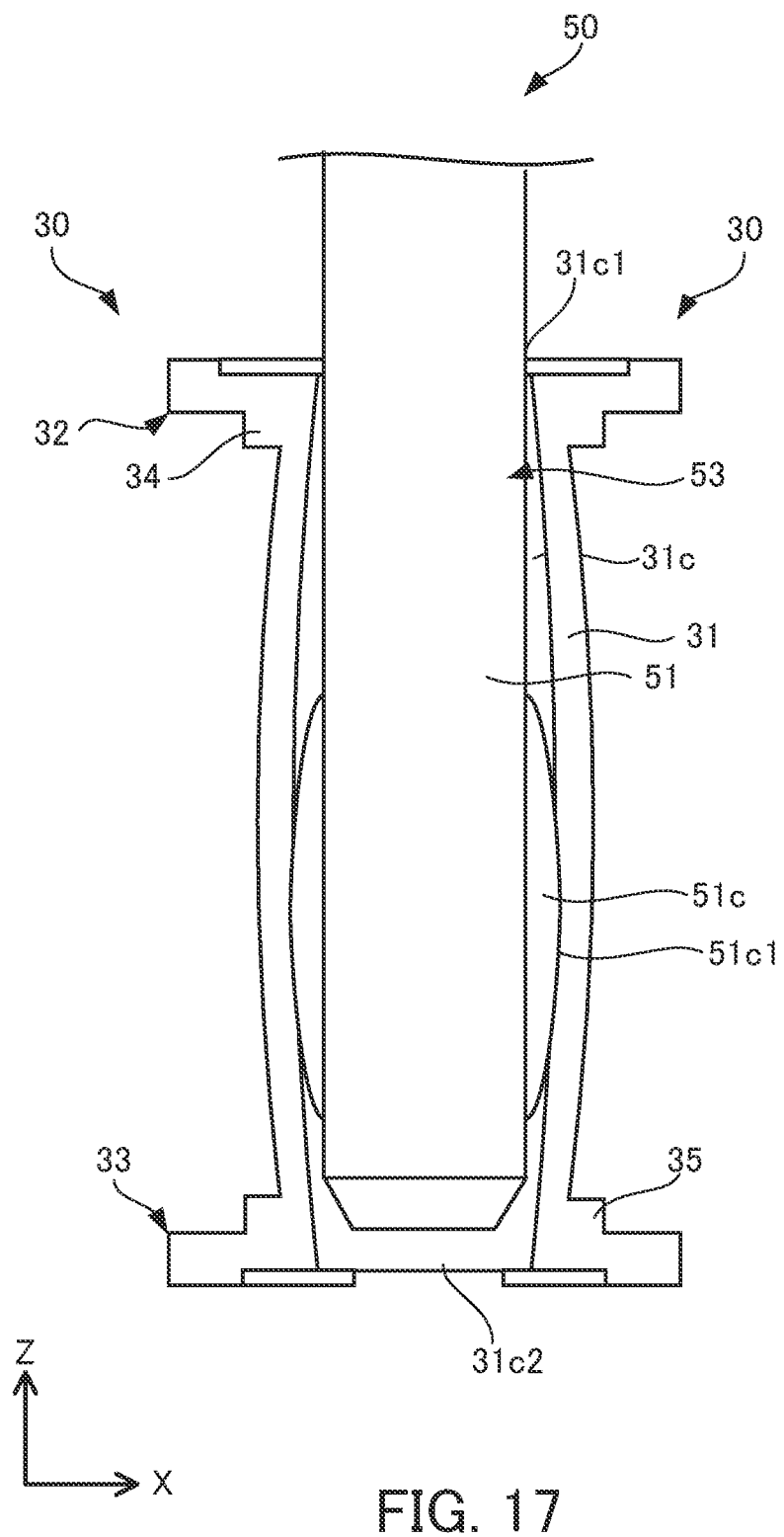
FIG. 17 is a sectional side view after press fitting of the external connection terminal into the contact component included in the semiconductor device according to the third embodiment.

As a third embodiment, press fitting of the external connection terminals 50 according to the first embodiment (see FIGS. 4 and 5) into the contact components 30 according to the second embodiment (see FIGS. 10A and 10B) will be described with reference to FIG. 16 and FIG. 17. FIG. 16 is a sectional side view before press fitting of an external connection terminal into a contact component included in a semiconductor device according to the third embodiment, and FIG. 17 is a sectional side view after press fitting of the external connection terminal into the contact component included in the semiconductor device according to the third embodiment.

First, in the same way as the first and second embodiments, each external connection terminal 50 is inserted from the tip portion 53 into the open end portion 31c1 of the through hole 31c of a contact component 30. When doing so, since the tip portion 53 is formed with the tapered surface 53a, the tip portion 53 may be easily inserted into the open end portion 31c1 of the through hole 31c. After this, the external connection terminal 50 is then further inserted toward the open end portion 31c2.

The reinforcing portion 34 is formed on the open end portion 31c1-side of each contact component 30. The length A1 of the external connection terminal 50 is longer than the inner diameter B1 of the through hole 31c. This means that as depicted in FIG. 16, when the external connection terminal 50 enters the open end portion 31c1 of the through hole 31c, pressure is exerted on the external connection terminal 50 by the inner circumferential surface 31a of the through hole 31c. This pressing force is larger than with a configuration that omits the reinforcing portion 34. This means that the insertion force for pressing the external connection terminal 50 in the insertion direction I increases. When the external connection terminal 50 has been inserted in the insertion direction I, the protruding portions 51c comes into contact with the open end portion 31c1.

When the external connection terminals 50 are pressed in by a large insertion force, the sliding surfaces 51c1 of the protruding portions 51c and the four corner portions 51a will enter the through hole 31c from the open end portion 31c1 and the external connection terminals 50 will advance in the insertion direction I with the sliding surfaces 51c1 of the protruding portions 51c and the four corner portions 51a sliding on the inner circumferential surface 31a of the through hole 31c.

During insertion, expansion of the open end portion 31c1 of each contact component 30 is suppressed due to the formation of the reinforcing portions 34. When the tip portion 53 of each external connection terminal 50 is inserted into a through hole 31c beyond the region corresponding to the reinforcing portion 34, the area between the reinforcing portion 34 and the reinforcing portion 35 of the main body portion 31 is pressed outward by the protruding portions 51c so as to expand outward beyond the open end portions 31c1 and 31c2.

When an external connection terminal 50 has been pressed into the through hole 31c along the insertion direction I, the parts of the sliding surfaces 51c1 of the protruding portions 51c with the greatest height from the outer surface portions 51b will fit against the inner circumferential surface 31a of the through hole 31c. When the tip portion 53 of the external connection terminal 50 reaches a position just before the open end portion 31c2 of the through hole 31c, the tip portion 53 of the external connection terminal 50 is clamped by the reinforcing portion 35. In this way, the external connection terminals 50 are more reliably prevented from advancing further in the insertion direction I than with the configurations according to the first and second embodiments (see FIG. 17). When the printed circuit board 60 is attached to the external connection terminals 50, it is possible to suppress the external connection terminals 50 from being excessively inserted into the contact components 30. Note that in the third embodiment also, the protruding portions 51c of the external connection terminals 50 are a mere example and may instead be hemispherical in shape. The contact components 30 may also have the same configuration as in the second embodiment or the second and third modifications.

According to the present embodiments, it is possible to prevent external connection terminals from coming off contact components, to prevent the occurrence of damage to a semiconductor device, and to prevent a drop in reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a conductive board;
   a contact component having a cylindrical through hole therein, and including a main body portion with a first open end and a second open end opposite to each other in an insertion direction orthogonal to a surface of the conductive board, the contact component at the first open end being joined to the conductive board; and
   an external connection terminal having four outer surfaces extending in the insertion direction to form a quadrangular prism shape, and being inserted into the through hole of the contact component in the insertion direction, the external connection terminal having four corner portions along the insertion direction pressed by an inner circumferential surface of the through hole of the contact component, wherein
   the external connection terminal has protrusions, each of which is disposed on a respective one of at least one pair of opposite outer surfaces among the four outer surfaces, and being pressed by the inner circumferential surface of the through hole.

2. The semiconductor device according to claim 1, wherein the external connection terminal is press-fitted into the through hole.

3. The semiconductor device according to claim 1, wherein each of the protrusions is disposed on a respective one of all of the outer surfaces of the external connection terminal.

4. The semiconductor device according to claim 1, wherein said each of the protrusions disposed on the respective one of the at least one pair of opposite outer surfaces extends in the insertion direction.

5. The semiconductor device according to claim 1, wherein said each protrusion provided on the respective one of the at least one pair of opposite outer surfaces has a first end and a second end opposite to each other in the insertion direction, the first end and the second end being respectively located, in a side view of the semiconductor device, between positions where the first open end and the second open end of the main body of the contact component are located.

6. The semiconductor device according to claim 1, wherein the main body portion of the contact component has an outer circumferential surface having uneven portions thereon, each uneven portion being located at a position corresponding to a position where a respective one of the four corner portions and the protrusions of the external connection terminal is located, so as to be bulged outward than the rest of portions other than the uneven portions of the outer circumferential surface.

7. The semiconductor device according to claim 1, wherein said each protrusion provided on the respective one of the at least one pair of opposite outer surfaces has a first end and a second end opposite to each other in the insertion direction, and has a height from the respective outer surface in a direction orthogonal to the respective outer surface greatest at a center of said each protrusion in the insertion direction, the height decreasing as a position approaches the first end or the second end from the center.

8. A semiconductor device, comprising:
a conductive board;
a contact component having a cylindrical through hole therein, and including a main body portion with a first open end and a second open end opposite to each other in an insertion direction, the main body portion having a flange provided at at least the first open end, the first open end being joined to the conductive board; and
an external connection terminal having a plurality of outer surfaces extending in an insertion direction to form a prism shape, and being inserted into the through hole of the contact component, the external connection terminal having corner portions along the insertion direction pressed by an inner circumferential surface of the through hole, wherein
the main body portion of the contact component has a ring-shaped reinforcing portion on an outer circumferential surface of the main body portion, the reinforcing portion flaring outward in a direction orthogonal to the outer circumferential surface, and being provided along a circumferential direction of the main body portion at at least one of the first open end or the second open end on the outer circumferential surface of the main body portion.

9. The semiconductor device according to claim 8, wherein the main body portion is provided as a tube having an inner circumferential surface and the outer circumferential surface that form concentric circles in a sectional plan view of the semiconductor device.

10. The semiconductor device according to claim 8, wherein the reinforcing portion is provided at the first open end and extends from the first open end in the insertion direction to have a predetermined length.

11. The semiconductor device according to claim 10, wherein a tip of the external connection terminal that is inserted in the main body portion is located at a predetermined position in the insertion direction from the first open end.

12. The semiconductor device according to claim 10, wherein a thickness of the reinforcing portion in a direction orthogonal to the outer circumferential surface of the main body portion decreases as a distance of a position from the first open end in the insertion direction increases.

13. The semiconductor device according to claim 8, wherein the reinforcing portion includes first and second reinforcing portions respectively provided at the first and second open ends on the outer circumferential surface of the main body portion.

14. The semiconductor device according to claim 8, wherein the external connection terminal has four outer surfaces to form a quadrangular prism shape, and includes protrusions, each of which is disposed on a respective one of at least one pair of opposite outer surfaces among the four outer surfaces, and being pressed by the inner circumferential surface of the through hole.

15. The semiconductor device according to claim 14, wherein said each protrusion provided on the respective one of the at least one pair of opposite outer surfaces has a first end and a second end opposite to each other in the insertion direction, the first end and the second end being respectively located, in a side view of the semiconductor device, between positions where the first open end and the second open end of the main body of the contact component are located.

* * * * *